United States Patent
Morita et al.

(10) Patent No.: US 10,839,767 B2
(45) Date of Patent: Nov. 17, 2020

(54) DISPLAY DRIVER, ELECTRO-OPTICAL DEVICE, AND ELECTRONIC APPARATUS

(71) Applicant: SEIKO EPSON CORPORATION, Tokyo (JP)

(72) Inventors: Akira Morita, Chino (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/708,615

(22) Filed: Dec. 10, 2019

(65) Prior Publication Data

US 2020/0184917 A1   Jun. 11, 2020

(30) Foreign Application Priority Data

Dec. 11, 2018   (JP) ................................. 2018-231290

(51) Int. Cl.
| | |
|---|---|
| G09G 5/00 | (2006.01) |
| G09G 3/36 | (2006.01) |
| H03F 3/45 | (2006.01) |
| H03M 1/80 | (2006.01) |

(52) U.S. Cl.
CPC ......... *G09G 3/3688* (2013.01); *G09G 3/3614* (2013.01); *H03F 3/45071* (2013.01); *H03M 1/808* (2013.01); *G09G 2310/027* (2013.01); *G09G 2310/0291* (2013.01); *H03F 2203/45151* (2013.01); *H03F 2203/45336* (2013.01)

(58) Field of Classification Search
CPC ............... G09G 3/3688; G09G 3/3614; G09G 2310/0291; G09G 2310/027; G09G 2320/0693; H03F 3/45071; H03F 2203/45151; H03F 2203/45336; H03M 1/808

See application file for complete search history.

(56) References Cited

U.S. PATENT DOCUMENTS

| | | |
|---|---|---|
| 5,453,757 A | 9/1995 | Date et al. |
| 5,648,791 A | 7/1997 | Date et al. |
| 2005/0073513 A1 | 4/2005 | Date |
| 2005/0200583 A1 | 9/2005 | Date |
| 2009/0160690 A1* | 6/2009 | Kawaguchi ......... H03M 1/1057 341/154 |

(Continued)

FOREIGN PATENT DOCUMENTS

| | | |
|---|---|---|
| JP | H05-094159 A | 4/1993 |
| JP | 2003-108097 A | 4/2003 |

(Continued)

*Primary Examiner* — Adam R. Giesy
(74) *Attorney, Agent, or Firm* — Oliff PLC

(57) ABSTRACT

A display driver includes an operational amplifier, a D/A conversion circuit, a resistance circuit, and a resistance element. The D/A conversion circuit includes first and second variable resistance circuits including one end to which first and second voltages are input and another end connected to an inverting input node. The resistance circuit is provided between the inverting input node and an output node. The resistor is provided between the output node and the inverting input node. A resistance value of the first variable resistance circuit is set based on upper bit data of display data. A resistance value of the second variable resistance circuit is set based on lower bit data of the display data.

10 Claims, 15 Drawing Sheets

(56) References Cited

U.S. PATENT DOCUMENTS

2013/0169461 A1* 7/2013 Sienko ............... H03M 1/0863
  341/153
2016/0217759 A1   7/2016 Morita

FOREIGN PATENT DOCUMENTS

| JP | 2006-139290 A | 6/2006 |
| JP | 2016-138957 A | 8/2016 |

* cited by examiner

| XPOL | DP0 | XD0 |
|---|---|---|
| 1 | 0 | VC |
| 1 | 1 | VSH |
| 0 | 0 | VC |
| 0 | 1 | VSL |

FIG. 6

| POL | DP6 | XU0 |
|---|---|---|
| 0 | 0 | VC |
| 0 | 1 | VSL |
| 1 | 0 | VC |
| 1 | 1 | VSH |

FIG. 8

DISPLAY DRIVER, ELECTRO-OPTICAL DEVICE, AND ELECTRONIC APPARATUS

The present application is based on, and claims priority from JP Application Serial Number 2018-231290, filed Dec. 11, 2018, the disclosure of which is hereby incorporated by reference herein in its entirety.

BACKGROUND

1. Technical Field

The present disclosure relates to a display driver, an electro-optical device, and an electronic apparatus.

2. Related Art

A display driver that drives an electro-optical panel includes a ladder resistance circuit that generates a plurality of voltages, a D/A conversion circuit that selects a gradation voltage corresponding to display data from among the plurality of voltages, and an amplifier circuit that amplifies or buffers the gradation voltage. A related technique of such a display driver is disclosed in, for example, JP-A-2016-138957. JP-A-2016-138957 discloses, in FIG. 10, a configuration in which a D/A conversion circuit is composed of a resistor string and a switching array, an output of the D/A conversion circuit is input to a voltage follower, and a voltage follower circuit drives a data line of an electro-optical panel.

In recent years, with the increasing definition and the increasing frame rate of electro-optical panels, the display driver has to drive the pixel at high speed within a short driving period. For example, in a method in which D/A conversion is performed using a resistor string and a switching array as in JP-A-2016-138957, it is difficult to shorten the settling time of the voltage follower input. The settling time is the time for charging the input parasitic capacitance of the voltage follower from the resistor string via the switching array. In order to reduce the driving time of the pixel, it is necessary to shorten the settling time of the voltage follower input, and therefore it is difficult to shorten the driving time in the method of JP-A-2016-138957.

SUMMARY

An aspect of the disclosure relates to a display driver including a first operational amplifier including a first non-inverting input node to which a reference voltage is input, the first operational amplifier being configured to drive a data line of an electro-optical panel, a first D/A conversion circuit including a first variable resistance circuit including one end to which a first voltage is input and another end connected to a first inverting input node of the first operational amplifier, a first resistance circuit provided between the first inverting input node and a first output node of the first operational amplifier, a second operational amplifier including a second non-inverting input node to which a reference voltage is input, a resistance element provided between a second output node of the second operational amplifier and the first inverting input node, a second D/A conversion circuit including a second variable resistance circuit including one end to which a second voltage is input and another end connected to a second inverting input node of the second operational amplifier, and a second resistance circuit provided between the second inverting input node and the second output node. A resistance value of the first variable resistance circuit is set based on upper bit data of display data, and a resistance value of the second variable resistance circuit is set based on lower bit data of the display data.

BRIEF DESCRIPTION OF THE DRAWINGS

FIG. 6 is a diagram illustrating an operation of a selector in the second D/A conversion circuit.

FIG. 8 is a diagram illustrating an operation of a selector in the first D/A conversion circuit.

DESCRIPTION OF EXEMPLARY EMBODIMENTS

A preferable embodiment of the present disclosure will be described in detail below. Note that the embodiments described below are not intended to unjustly limit the content of the present disclosure as set forth in the claims, and all of the configurations described in the embodiments are not always required to solve the issues described in the present disclosure.

1. Display Driver

Figure 1:
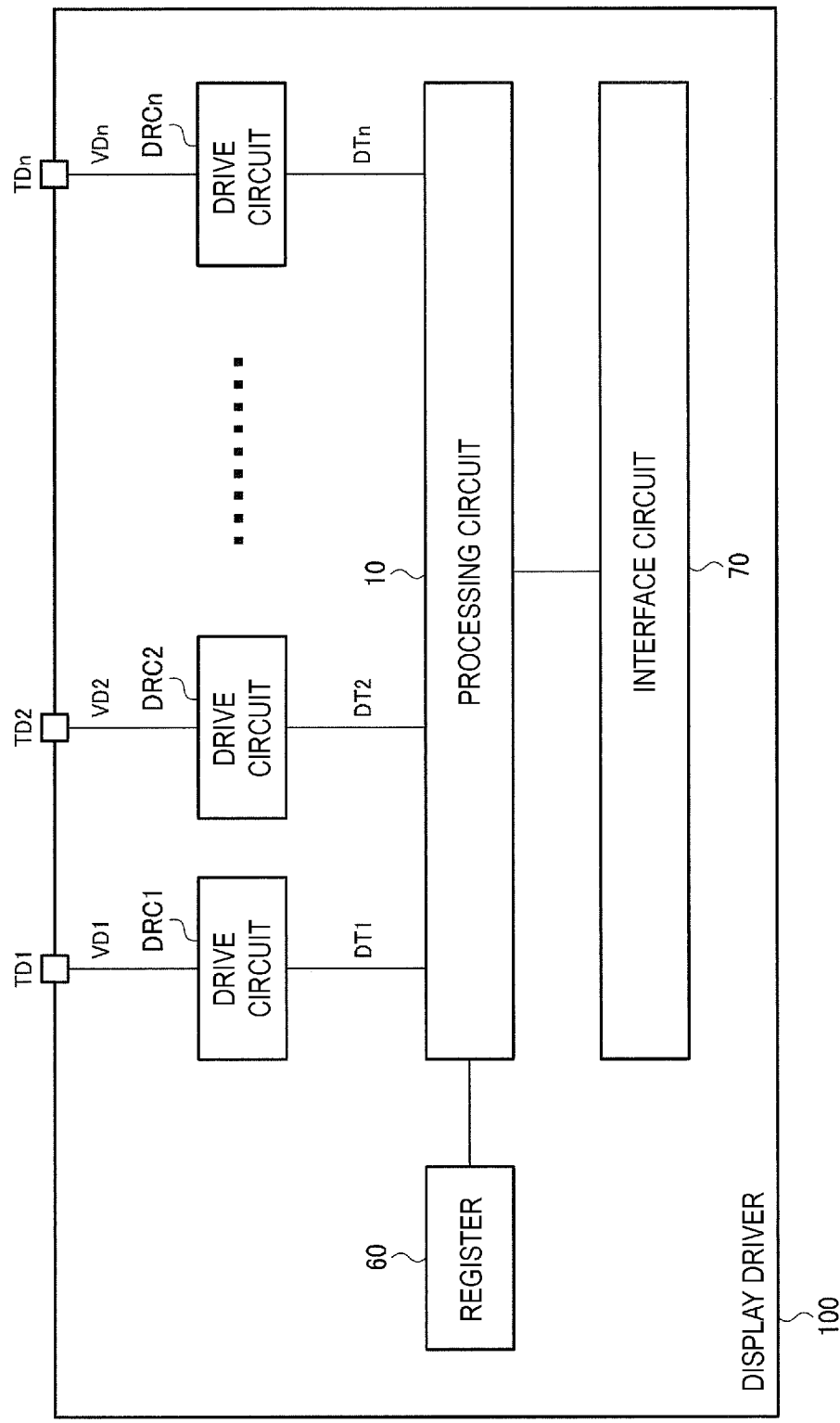
FIG. 1 illustrates an exemplary configuration of a display driver.

FIG. 1 illustrates an exemplary configuration of a display driver 100. The display driver 100 illustrated in FIG. 1 drives an electro-optical panel by supplying a data voltage to the pixels of the electro-optical panel. The electro-optical panel may be, for example, an electro luminescence (EL) panel or a liquid crystal display panel of an active-matrix type. The display driver 100 is an integrated circuit device.

The display driver 100 includes data voltage output terminals TD1 to TDn, drive circuits DRC1 to DRCn, D/A conversion circuits DAC1 to DACn, a processing circuit 10, a register 60, and an interface circuit 70. Note that n is an integer of 3 or greater.

The interface circuit 70 establishes communication between the display driver 100 and an external processing device disposed outside the display driver 100. The external device is, for example, a display controller, a CPU, a microcomputer, or the like. The interface circuit 70 receives a timing control signal and a display data from the external device. The timing control signal is a pixel clock signal, a horizontal synchronization signal, a vertical synchronization signal, and a data enable signal. Examples of the communication scheme of the interface circuit 70 may include an LVDS (Low Voltage Differential Signal) scheme, an RGB parallel method, a transmission scheme for the display port standard, and the like. The interface circuit 180 may include a control circuit and an input-output buffer circuit for implementing the above-mentioned communication schemes.

The processing circuit 10 outputs display data DT1 to the drive circuit DRC1. Likewise, the processing circuit 10 outputs display data DT2 to DTn to the drive circuits DRC2 to DRCn. In addition, the processing circuit 10 controls each unit of the display driver 100. For example, the processing circuit 10 performs timing control when the display driver 100 drives the electro-optical panel on the basis of a timing control signal received by the interface circuit 70. The processing circuit 10 is a logic circuit. The logic circuit includes logic elements and signal lines connecting between the logic elements, and the function of the logic circuit 10 is achieved by the logic elements and the signal lines. Alternatively, the processing circuit 10 may be a processor such as a DSP (Digital Signal Processor). In this case, the function of the processing circuit 10 is achieved when the processor executes the program in which the function of the processing circuit 10 is described.

The drive circuit DRC1 D/A converts the display data DT1 to a data voltage VD1 corresponding to the display data DT1, and outputs the data voltage VD1 to the data voltage output terminal TD1. Likewise, the drive circuits DRC2 to DRCn D/A convert the display data DT2 to DTn to data voltages VD2 to VDn corresponding to the display data DT2 to DTn, and output the data voltages VD2 to VDn to the data voltage output terminals TD2 to TDn.

Each of the drive circuits DRC1 to DRCn is a binary-weighting D/A conversion circuit. The binary-weighting D/A conversion circuit includes an operational amplifier, a variable resistance circuit, and a feedback resistor. The variable resistance circuit includes a plurality of resistances whose resistance values are binary-weighted, and, in accordance with bits of the display data, the resistances weighted in accordance with the bits are connected to the power source. As a result, the power supply voltage is multiplied by a gain corresponding to the display data, and thus a data voltage corresponding to the display data is output. As described later, in the present embodiment, the binary-weighting D/A conversion circuit that performs D/A conversion on upper bit data of the display data and a binary-weighting D/A conversion circuit that performs D/A conversion on lower bit data of the display data are connected in series.

The register 60 stores offset correction data for correcting the offset of the data voltage output by the drive circuit DRC1. Likewise, the register 60 stores offset correction data for correcting the offsets of the data voltages output by the drive circuits DRC2 to DRCn. A calibration process for determining the offset correction data, and offset correction using the offset correction data will be described later.

The data voltage output terminals TD1 to TDn are pads formed in a semiconductor substrate of the integrated circuit device or terminals provided in the package of the integrated circuit device. The data voltage output terminals TD1 to TDn are aligned along the long side direction of the display driver 100. The data voltage output terminals TD1 to TDn are connected to the data voltage input terminal of the electro-optical panel through a wiring line, a cable or the like on the circuit board.

Figure 2:
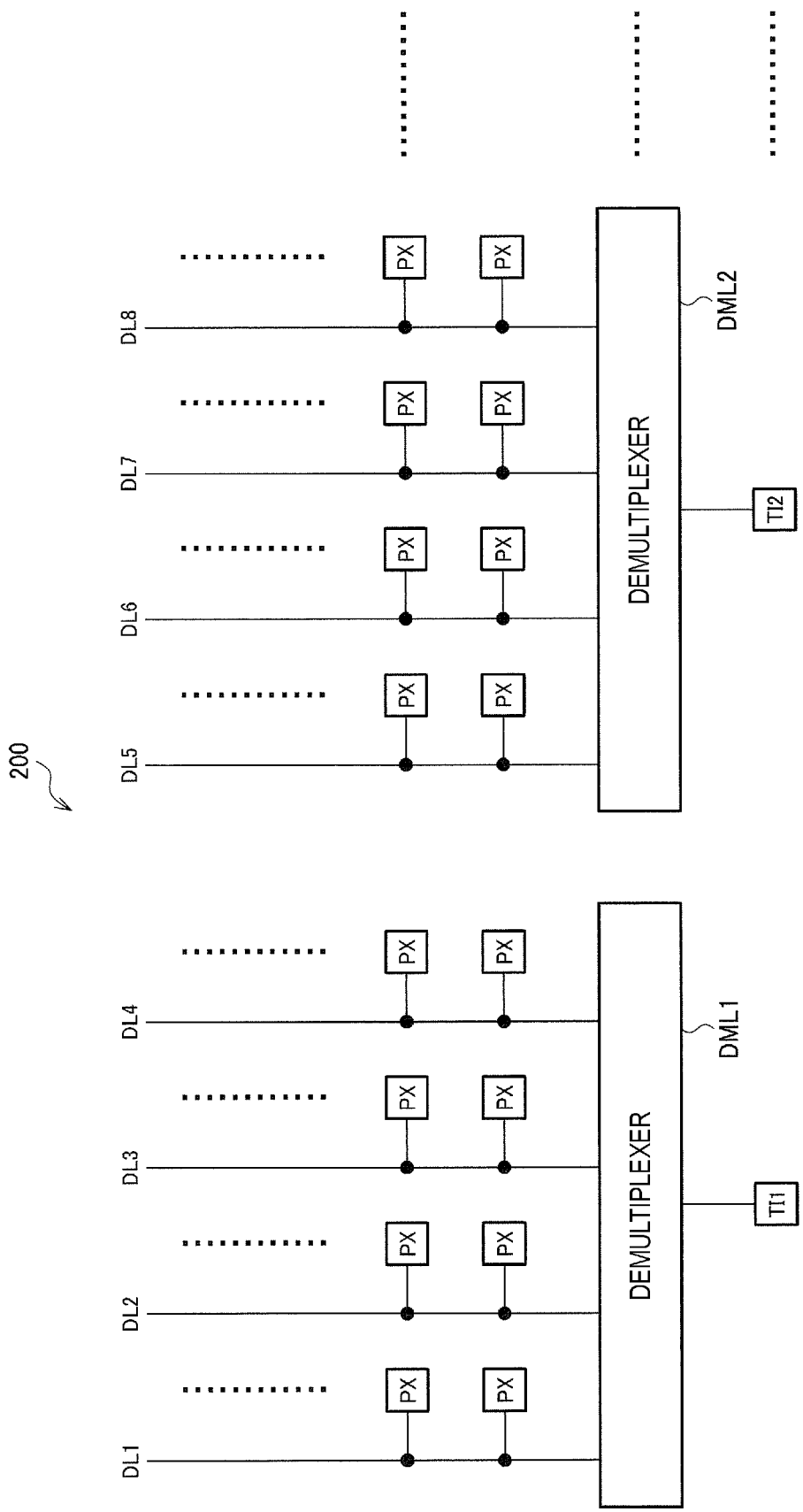
FIG. 2 illustrates an exemplary configuration of an electro-optical panel.

FIG. 2 illustrates an exemplary configuration of an electro-optical panel 200 configured to be driven by the display driver 10. The electro-optical panel 200 includes data voltage input terminals TI1 and TI2, a demultiplexers DML1 and DML2, data lines DL1 to DL8, and a plurality of pixels PX. While FIG. 2 illustrates only portions connected to the data voltage input terminals TI1 and TI2, the portions connected to the data voltage input terminal TI3 and succeeding terminals also have similar configurations.

Operations of the display driver 100 and the electro-optical panel 200 are described below with reference to FIGS. 1 and 2. While an operation of the display driver 100 for the data voltage VD1 is described as an example here, the display driver 100 operates in a similar manner also for the data voltages VD2 to VDn. In addition, while an example case will be described in which the display driver 100 performs a multi-multiplex driving having a multinumber of four, the multinumber is not limited as long as the number is two or greater.

The processing circuit 10 outputs first to fourth display data in a time-division manner as the display data DT1 in the horizontal scanning period. Specifically, the processing circuit 10 outputs the first to fourth display data in a time series manner. As a result, first to fourth data voltages are output in a time-division manner from the drive circuit DRC1 as the data voltage VD1. The first to fourth data voltages are voltages obtained through D/A conversion on the first to fourth display data.

The data voltage output terminal TD1 is connected to the data voltage input terminal TI1 of the electro-optical panel 200. The data voltage input terminal TI1 is connected to the data lines DL1 to DL4 through the demultiplexer DML1. The data lines DL1 to DL4 are data lines arranged side-by-side in the horizontal scanning direction in the electro-optical panel 200. Each data line is connected to a pixel PX. In the horizontal scanning period, the demultiplexer DML1 sequentially selects the first to fourth data lines DL1 to DL4 and connects it to the data voltage input terminal TI1. Specifically, when an operational amplifier AM1 is outputting a first data voltage, the demultiplexer DML1 connects the first data line DL1 to the data voltage input terminal TI1. As a result, the first data line DL1 is driven by the first data voltage. Likewise, the second to fourth data lines DL2 to DL4 are driven by the second to fourth data voltages. Note that the order of driving the first to fourth data lines DL1 to DL4 in the horizontal scanning period is not limited to the above-mentioned order, and any order may be adopted. In the above-mentioned manner, the operational amplifier AM1 drives the data lines of the electro-optical panel. Specifically, the operational amplifier AM1 supplies a data voltage to a data line of the electro-optical panel. For example, while the operational amplifier AM1 drives the first to fourth data lines DL1 to DL4 via the demultiplexer DML1, the operational amplifier AM1 may directly drive the first data line DL1.

The display driver 100 performs polarity inversion driving. The polarity inversion driving is, for example, frame inversion driving or line inversion driving. The frame inversion driving is a technique of inverting the polarity of the data voltage on a single frame basis or a multiple-frame basis. The frame is a vertical scanning period. The line inversion driving is a driving technique of inverting the polarity of the data voltage on a single scan line basis or a multiple-scan line basis. In a frame or a line of positive polarity driving, the drive circuits DRC1 to DRCn output a positive data voltage that is higher than the common voltage. In a frame or a line of negative polarity driving, the drive circuits DRC1 to DRCn output a negative data voltage that is lower than the common voltage.

2. First Embodiment

Figure 3:
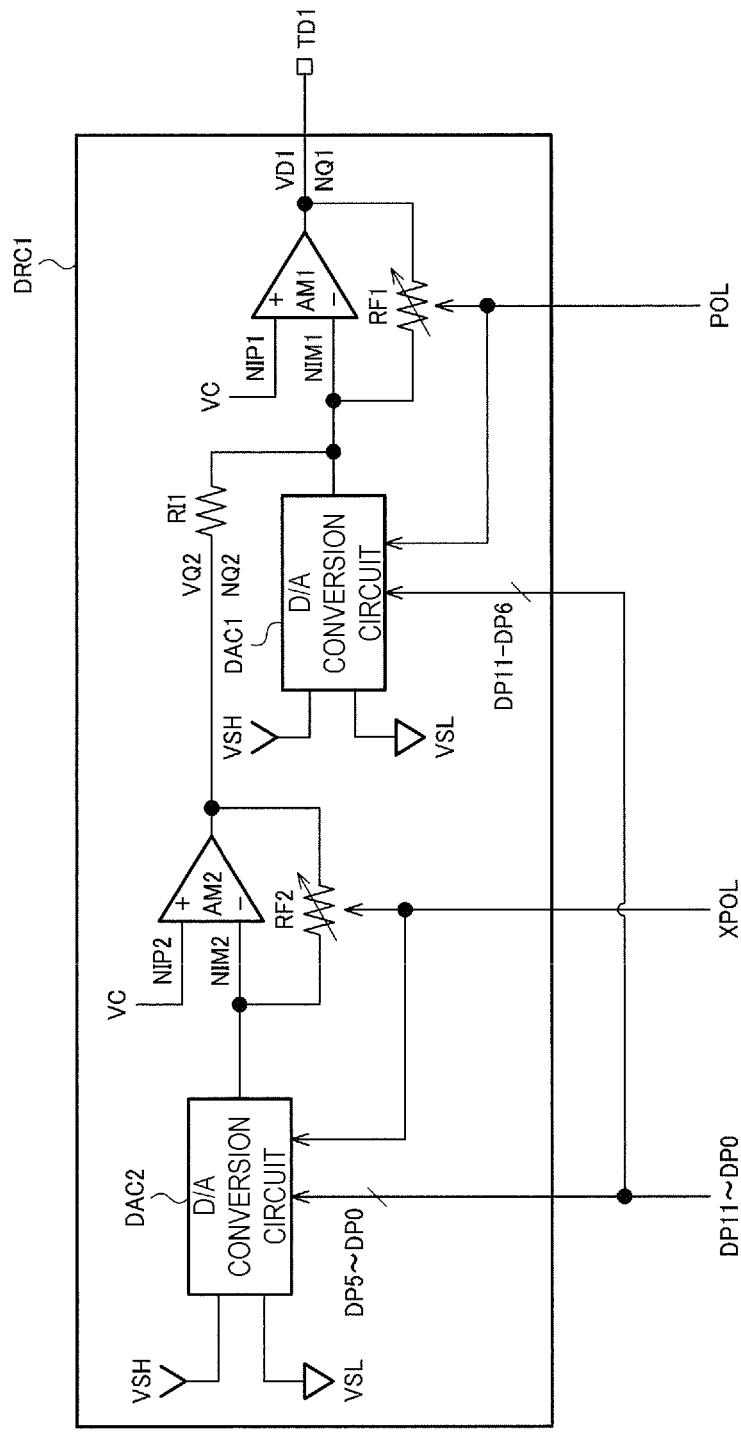
FIG. 3 illustrates an exemplary configuration of a drive circuit in a first embodiment.

FIG. 3 is an exemplary configuration of the drive circuit DRC1 according to a first embodiment. While the drive circuit DRC1 is described below as an example, the drive circuits DRC2 to DRCn also have similar configurations. In addition, in an exemplary case described below, the display data DT1 is 12 bits. In FIG. 3, the display data DT1 is denoted as DP11 to DP0, and each of the DP11 to DP0 is a bit signal of the display data. The DP11 is the MSB (Most Significant Bit) of the DT1 and the DP0 is the LSB (Least Significant Bit) of the DT1. However, the number of bits of the display data is not limited to 12 bits, and any number of bits may be adopted.

The drive circuit DRC1 includes the operational amplifier AM1 that is a first operational amplifier, the D/A conversion circuit DAC1 that is a first D/A conversion circuit, a resistance circuit RF1 that is a first resistance circuit, a resistance element RI1, an operational amplifier AM2 that is a second operational amplifier, a D/A conversion circuit DAC2 that is a second D/A conversion circuit, and a resistance circuit RF2 that is a second resistance circuit.

An inverting input node NIM1, a non-inverting input node NIP1, and an output node NQ1 of the operational amplifier AM1 are a first inverting input node, a first non-inverting input node, and a first output node, respectively. The operational amplifier AM1 drives the data lines of the electro-optical panel 200 by outputting the data voltage VD1 to the output node NQ1. The output node NQ1 is connected to the data voltage output terminal TD1, and a reference voltage VC is input to the non-inverting input node NIP1. The reference voltage VC is a voltage same as the common voltage supplied to the common electrode of the electro-optical panel.

Here, "connect" means a connected state where an electrical signal can be transmitted. A connection that enables transmission of information in the form of an electrical signal is an electrical connection, and, for example, a connection through a signal line, a passive element or the like may be included.

A first voltage is input to one end of the D/A conversion circuit DAC1. A power supply voltage VSL that is a first power supply voltage, or a power supply voltage VSH that is a second power supply voltage is selected as the first voltage on the basis of a polarity signal POL. The VSH is greater than the VSL. The polarity signal POL is a signal representing the driving polarity and is supplied from the processing circuit 10. The other end of the D/A conversion circuit DAC1 is connected to the inverting input node NIM1 of the operational amplifier AM1. The D/A conversion circuit DAC1 is a first variable resistance circuit. The resistance value of the first variable resistance circuit is set based on the upper bit data DP11 to DP6 of the display data. Specifically, the resistance value of the first variable resistance circuit is set to a binary-weighted resistance value for each bit of the DP11 to DP6.

The resistance circuit RF1 is provided between the inverting input node NIM1 and the output node NQ1. Specifically, one end of the resistance circuit RF1 is connected to the inverting input node NIM1, and the other end thereof is connected to the output node NQ1. The resistance circuit RF1 is capable of selecting a binary resistance value corresponding to the polarity. The resistance value of the resistance circuit RF1 is selected by the polarity signal POL. Note that in the case of |VSH−VC|=|VSL−VC|, the resistance value of the resistance circuit RF1 may be a fixed value.

An inverting input node NIM2, a non-inverting input node NIP2, and an output node NQ2 of the operational amplifier AM2 are a second inverting input node, a second non-inverting input node, and a second output node, respectively. The operational amplifier AM2 outputs a voltage VQ2 to the output node NQ2. The reference voltage VC is input to the non-inverting input node NIP2.

The resistance element RI' is provided between the output node NQ2 of the operational amplifier AM2 and the inverting input node NIM1 of the operational amplifier AM1. Specifically, one end of the resistance element RI' is connected to the output node NQ2 and the other end thereof is connected to the inverting input node NIM1.

The second voltage is input to one end of the D/A conversion circuit DAC2. The power supply voltage VSL or the power supply voltage VSH is selected as the second voltage on the basis of a reverse polarity signal XPOL. The XPOL is a signal obtained through logical inversion of POL, and is supplied from the processing circuit 10. The other end of the D/A conversion circuit DAC2 is connected to the inverting input node NIM2 of the operational amplifier AM2. The D/A conversion circuit DAC2 is a second variable resistance circuit. The resistance value of the second variable resistance circuit is set based on the lower bit data DP5 to DP0 of the display data. Specifically, the resistance value of the second variable resistance circuit is set to a binary-weighted resistance value for each bit of DP5 to DP0.

The resistance circuit RF2 is provided between the inverting input node NIM2 and the output node NQ2. Specifically, one end of the resistance circuit RF2 is connected to the inverting input node NIM2, and the other end thereof is connected to the output node NQ2. The resistance circuit RF2 is capable of selecting a binary resistance value corresponding to the polarity. The resistance value of the resistance circuit RF2 is selected by the reverse polarity signal XPOL. Note that in the case of |VSH−VC|=|VSL−VC|, the resistance value of the resistance circuit RF2 may be a fixed value.

In the above-described configuration, the D/A conversion circuit DAC1, the operational amplifier AM1 and the resistance circuit RF1 constitute a first binary-weighting D/A conversion circuit that performs D/A conversion on the upper bit data. The D/A conversion circuit DAC2, the operational amplifier AM2 and the resistance circuit RF2 constitute a second binary-weighting D/A conversion circuit that performs D/A conversion on the lower bit data.

According to the present embodiment, the drive circuit DRC1 is composed of the binary-weighting D/A conversion circuit and thus the driving speed can be increased in comparison with a D/A conversion circuit using a ladder resistance circuit. For example, in the first binary-weighting D/A conversion circuit, the resistance value of the D/A conversion circuit DAC1 connected between the power supply and the inverting input node NIM1 of the operational amplifier AM1 is set based on the upper bit data DP11 to DP6. As a result, the current flowing from the power source to the inverting input node NIM1 is controlled based on the upper bit data DP11 to DP6. By performing such current driven electric potential generation, the speed of the change in data voltage can be increased.

In the present embodiment, the display data DT1 is 12 bits. If a case is assumed in which the drive circuit is composed of a single stage binary-weighting D/A conversion circuit, 20 to 211 is required as the binary weight for the resistance value. Specifically, it is necessary to provide a resistance of 211 times for the minimum resistance. Consequently, the circuit size of the drive circuit is considerably increased. In contrast, the present embodiment adopts a configuration in which the two binary-weighting D/A conversion circuits are connected in series. As a result, in each of the binary-weighting D/A conversion circuits, the binary weight for the resistance value is 2o to 25. Thus, the circuit size of the drive circuit can be reduced.

Figure 4:
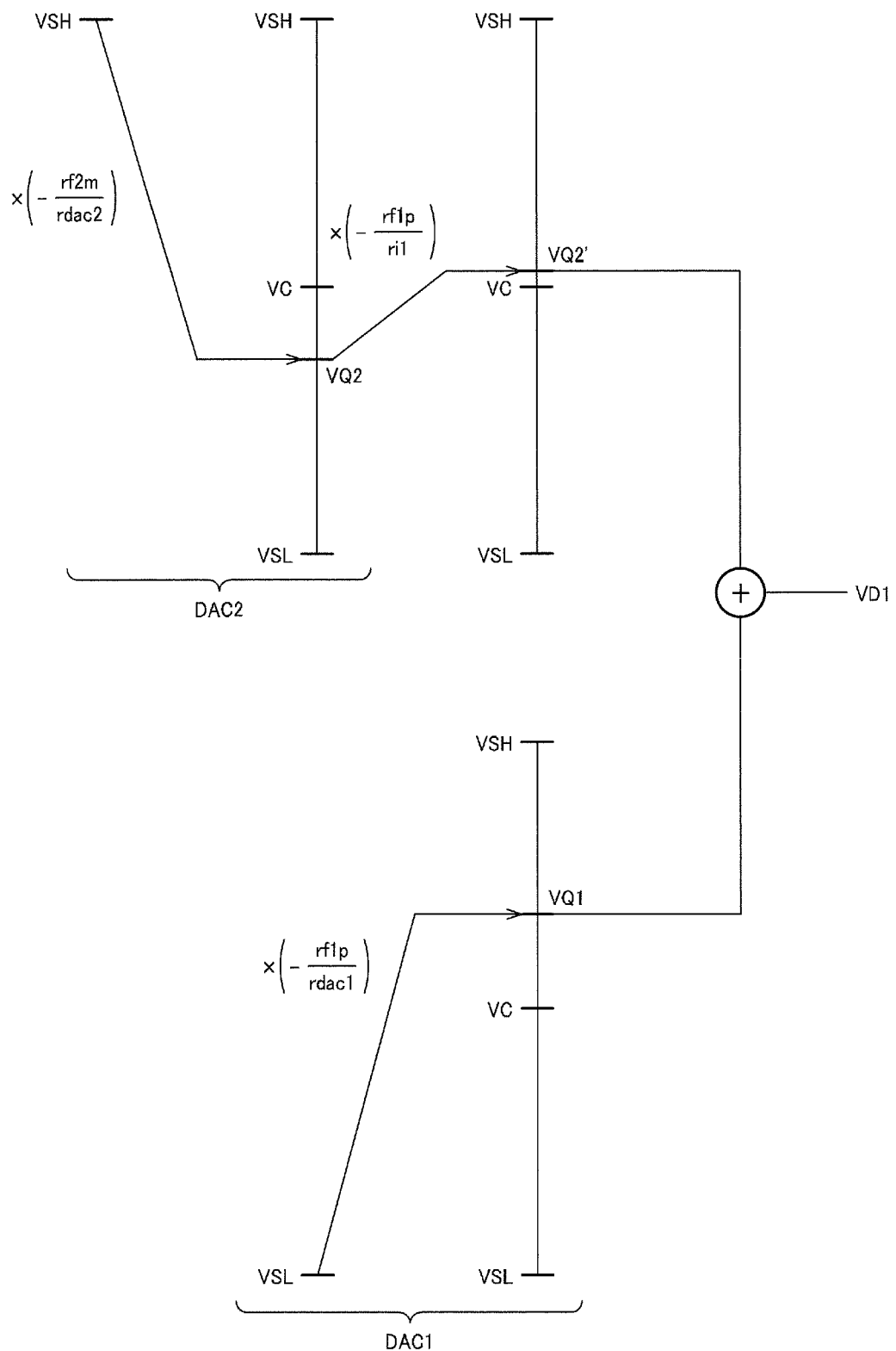
FIG. 4 is a diagram illustrating an operation of the drive circuit.

Detailed operations and configurations of the drive circuit DRC1 are described below. FIG. 4 is a diagram illustrating an operation of the drive circuit DRC1. FIG. 4 illustrates an operation that is performed when the drive circuit DRC1 outputs a positive data voltage VD1. In this case, it is assumed in FIG. 3 that POL=H and XPOL=L hold.

The resistance value of the D/A conversion circuit DAC2 set by the lower bit data DP5 to DP0 is rdac2. In addition, when XPOL=L, the resistance value of the resistance circuit RF2 is rf2$m$. Here, the voltage VQ2 obtained by D/A conversion of the lower bit data DP5 to DP0 is expressed in Equation (1). The voltage VQ2 is negative.

[Mathematical Equation 1]

$$VQ2 - VC = |VSH - VC| \times \left(-\frac{rf2m}{rdac2}\right) \quad (1)$$

The resistance value of the resistance element RI' is ri1. In addition, when POL=H, the resistance value of the resistance circuit RF1 is rf1$p$. Here, as expressed in the following Equation (2), inverting amplification of the voltage VQ2 to a voltage VQ2' is performed. The voltage VQ2' is positive.

[Mathematical Equation 2]

$$VQ2' - VC = |VQ2 - VC| \times \left(-\frac{rf1p}{ri1}\right) \quad (2)$$
$$= |VQ2 - VC| \times \frac{rf1p}{ri1}$$

The resistance value of the D/A conversion circuit DAC1 set by the upper bit data DP11 to DP6 is rdac1. Here, the voltage VQ1 obtained by D/A conversion of the upper bit data DP11 to DP6 is expressed in following Equation (3). The voltage VQ1 is positive.

[Mathematical Equation 3]

$$VQ1 - VC = -|VSL - VC| \times \left(-\frac{rf1p}{rdac1}\right) \quad (3)$$
$$= |VSL - VC| \times \frac{rf1p}{rdac1}$$

As expressed in following Equation (4), the voltage obtained by adding the voltage VQ1 and the voltage VQ2' on the basis of the reference voltage VC is the data voltage VD1.

[Mathematical Equation 4]

$$VD1 - VC = (VQ1 - VC) + (VQ2' - VC) \quad (4)$$
$$= |VSL - VC| \times \frac{rf1p}{rdac1} + |VSH - VC| \times \left(\frac{rf2m}{rdac2} \times \frac{rf1p}{ri1}\right)$$

The resistance value of the resistance circuit RF2 with POL=L and XPOL=H is rf2$p$. A relationship between rf2$p$ and rf2$m$ is expressed in Equation (5).

[Mathematical Equation 5]

$$rf2m = \frac{|VSL - VC|}{|VSH - VC|} \times rf2p \quad (5)$$

By substituting the Equation (5) in the Equation (4), the data voltage VD1 expressed in the following Equation (6) is obtained. With a setting of rf2$p$=rf1$p$ and rf1$p$/ri1=1/26, the data voltage VD1 resulting from D/A conversion of DP11 to DP0 can be obtained.

[Mathematical Equation 6]

$$VD1 - VC = |VSL - VC| \times \left(\frac{rf1p}{rdac1} + \frac{rf2p}{rdac2} \times \frac{rf1p}{ri1}\right) \quad (6)$$
$$= |VSL - VC| \times \left(\frac{rf1p}{rdac1} + \frac{rf1p}{rdac2} \times \frac{1}{2^6}\right)$$

Next, an operation in which the drive circuit DRC1 outputs the negative data voltage VD1 is described. In this case, it is assumed in FIG. 3 that POL=L and XPOL=H. The resistance value of the resistance circuit RF1 with POL=L is rf1$m$ and the resistance value of the resistance circuit RF2 with XPOL=H is rf2$p$. As in the case of the positive electrode driving, the following Equations (7) to (12) are obtained. As expressed in the following Equation (12), the data voltage VD1 resulting from D/A conversion of DP11 to DP0 is obtained.

[Mathematical Equation 7]

$$VQ2 - VC = -|VSL - VC| \times \left(-\frac{rf2p}{rdac2}\right) \quad (7)$$
$$= |VSL - VC| \times \frac{rf2p}{rdac2}$$

[Mathematical Equation 8]

$$VQ2' - VC = |VQ2 - VC| \times \left(-\frac{rf1m}{ri1}\right) \quad (8)$$

[Mathematical Equation 9]

$$VQ1 - VC = |VSH - VC| \times \left(-\frac{rf1m}{rdac1}\right) \quad (9)$$

[Mathematical Equation 10]

$$VD1 - VC = (VQ1 - VC) + (VQ2' - VC) \quad (10)$$
$$= |VSH - VC| \times \left(-\frac{rf1m}{rdac1}\right) +$$
$$|VSL - VC| \times \left(-\frac{rf2p}{rdac2} \times \frac{rf1m}{ri1}\right)$$

-continued

[Mathematical Equation 11]

$$rf2p = \frac{|VSH - VC|}{|VSL - VC|} \times rf2m \quad (11)$$

[Mathematical Equation 12]

$$VD1 - VC = -|VSH - VC| \times \left(\frac{rf1m}{rdac1} + \frac{rf2m}{rdac2} \times \frac{rf1m}{ri1}\right) \quad (12)$$

According to the embodiment, when the operational amplifier AM1 drives the data line in the positive polarity, the resistance value of the resistance circuit RF1 is set to a first resistance value, and the resistance value of the resistance circuit RF2 is set to a second resistance value. The first resistance value is rf1p and the second resistance value is rf2m. On the other hand, when the operational amplifier AM1 drives the data line in the negative polarity, the resistance value of the resistance circuit RF1 is set to a third resistance value different from the first resistance value, and the resistance value of the resistance circuit RF2 is set to a fourth resistance value different from the second resistance value. The third resistance value is rf1m and the fourth resistance value is rf2p.

In this manner, appropriate gains can be set in accordance with the driving polarity. Specifically, in the binary-weighting D/A conversion circuit, a gain corresponding to the display data is applied to the difference |VSL−VC| between the first power supply voltage and the reference voltage or the difference |VSH−VC| between the second power supply voltage and the reference voltage. From the differences, the difference to be multiplied by the gain is selected in accordance with the driving polarity. When |VSL−VC| and |VSH−VC| are different from each other, the result obtained by multiplying |VSL−VC| by the gain and the result obtained by |VSH−VC| by the gain are different from each other. Specifically, the gradation value varies depending on the driving polarity. According to the present embodiment, appropriate gains can be set such that the result obtained by multiplying |VSL−VC| by the gain and the result obtained by multiplying |VSH−VC| by the gain are identical to each other. To be more specific, it suffices to set the rf2m and rf2p as in the Equation (5). Likewise, it suffices to set the rf1p and rf1m as rf1m=(|VSL−VC|/|VSH−VC|)×rf1p.

In the present embodiment, the first voltage is supplied to one end of the D/A conversion circuit DAC1, and the second voltage is supplied to one end of the D/A conversion circuit DAC2. When the operational amplifier AM1 drives the data line in the positive polarity, the first voltage is set to the power supply voltage VSL that is lower than the reference voltage VC, and the second voltage is set to the power supply voltage VSH that is higher than the reference voltage VC. When the operational amplifier AM1 drives the data line in the negative polarity, the first voltage is set to the power supply voltage VSH, and the second voltage is set to the power supply voltage VSL.

In this manner, the positive data voltage VD1 is output in the positive polarity driving, and the negative data voltage VD1 is output in the negative polarity driving. Specifically, the binary-weighting D/A conversion circuit of the present embodiment is an inverting amplifier circuit. In the positive polarity driving, the power supply voltage VSL that is lower than the reference voltage VC is supplied to one end of the D/A conversion circuit DAC1, and accordingly the positive data voltage VD1 is output by inverting amplification. In addition, the power supply voltage VSH that is higher than the reference voltage VC is supplied to one end of the D/A conversion circuit DAC2, and accordingly the operational amplifier AM2 outputs the negative voltage VQ1 by inverting amplification. Then, inverting amplification is performed on this voltage, and thus the positive data voltage VD1 is output. Likewise, in the negative polarity driving, the power supply voltage VSH that is higher than the reference voltage VC is supplied to one end of the D/A conversion circuit DAC1, and the power supply voltage VSL that is lower than the reference voltage VC is supplied to one end of the D/A conversion circuit DAC2, and thus, the negative data voltage VD1 is output.

Figure 5:
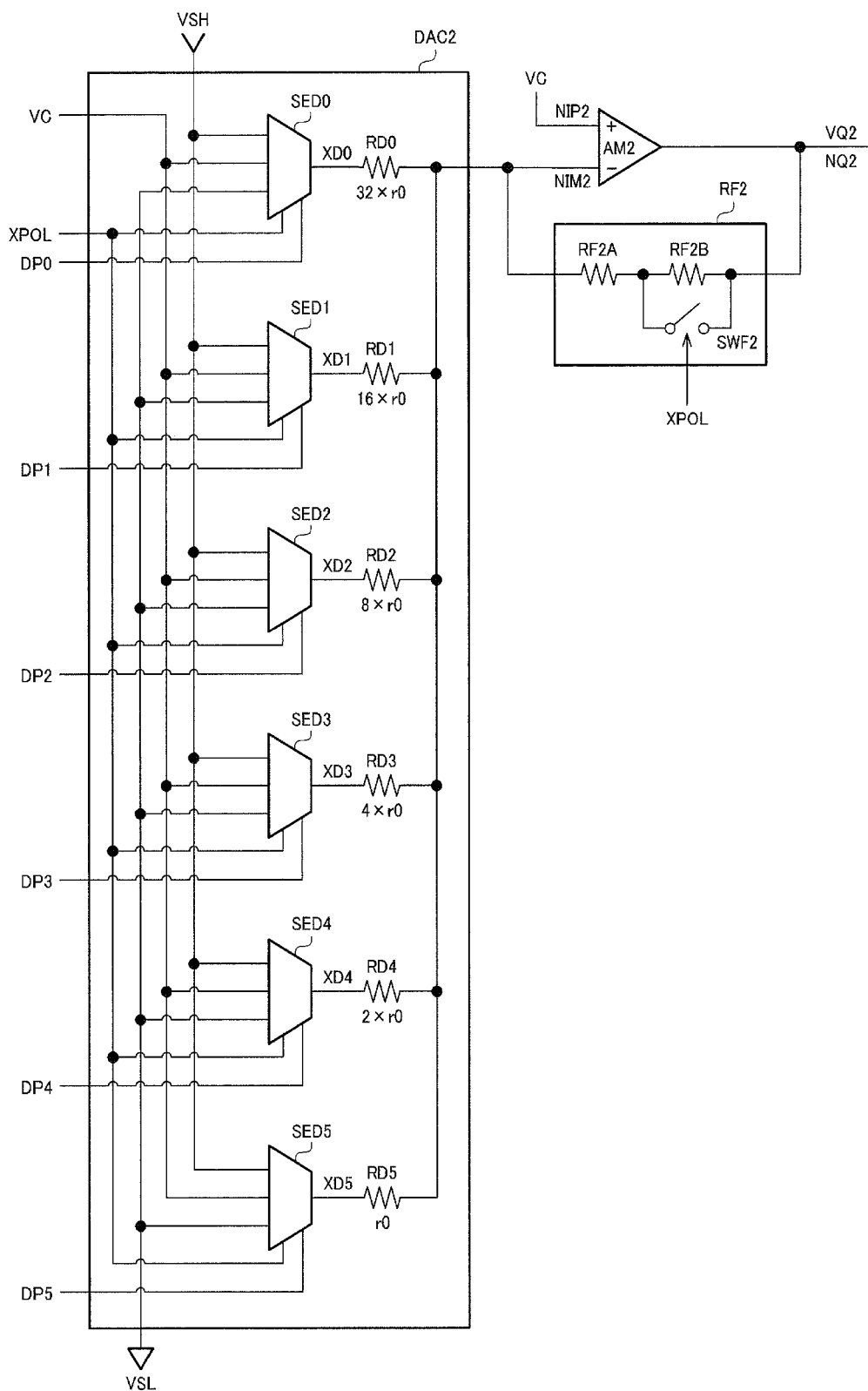
FIG. 5 illustrates a detailed exemplary configuration of a second D/A conversion circuit and a second resistance circuit in the first embodiment.

FIG. 5 illustrates a detailed exemplary configuration of the D/A conversion circuit DAC2 and the resistance circuit RF2 in the first embodiment.

The resistance circuit RF2 includes a resistance element RF2A, a resistance element RF2B, and a switch element SWF2. One end of the resistance element RF2A is connected to the inverting input node NIM2 and the other end thereof is connected to one end of the resistance element RF2B. The other end of the resistance element RF2B is connected to the output node NQ2. The switch element SWF2 is connected in parallel to the resistance element RF2B. The switch is, for example, a transistor.

The resistance values of the resistance elements RF2A and RF2B are rf2a and rf2b, respectively. Note that the on resistance of the switch element SWF2 is assumed to be zero. The switching element SWF2 is turned on and off by a reverse polarity signal XPOL. When XPOL=L, the switch element SWF2 is on. At this time, the resistance value of the resistance circuit RF2 is rf2m=rf2a. When XPOL=H, the switch element SWF2 is off. At this time, the resistance value of the resistance circuit RF2 is rf2p=rf2a+rf2b. The rf2a and rf2b are set to satisfy the Equation (5). Note that it is assumed here that |VSH−VC|>|VSL−VC| holds. Also, rf2p=rf2a+rf2b=r0/2 holds. The r0 is the resistance value of a resistance element RD5 included in the D/A conversion circuit DAC2 as described later.

The D/A conversion circuit DAC2 includes selectors SED0 to SED5 and resistance elements RD0 to RD5.

The selector SED0 selects the power supply voltage VSH, the supply voltage VSL or the reference voltage VC on the basis of a bit signal DP0 and the reverse polarity signal XPOL. The selector SED0 outputs the selected voltage to one end of the resistance element RD0. The other end of the resistance element RD0 is connected to the inverting input node NIM2. Likewise, the selectors SED1 to SED5 select the power supply voltage VSH, the supply voltage VSL or the reference voltage VC on the basis of the bit signals DP1 to DP5 and the reverse polarity signal XPOL. The selectors SED1 to SED5 output the selected voltage to one ends of the resistance elements RD1 to RD5. The other ends of the resistance elements RD1 to RD5 are connected to the inverting input node NIM2. The selectors SED0 to SED5 are switch circuits composed of, for example, transistors.

Figure 6:
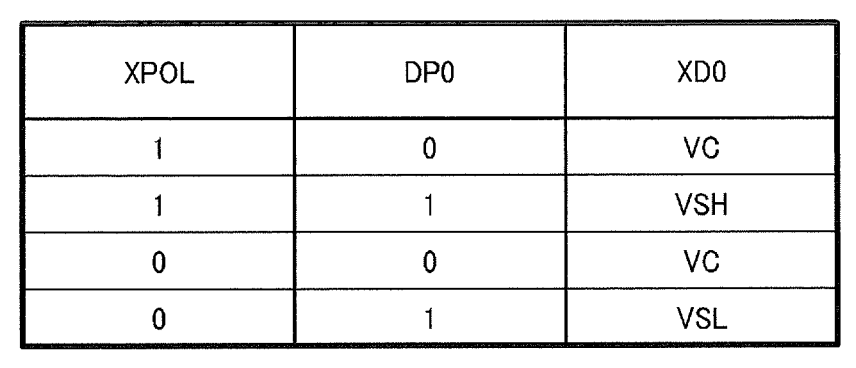

FIG. 6 is a diagram illustrating an operation of the selector SED0. In FIG. 6, "0" represents a low level, and "1" represents a high level. While the selector SED0 is described as an example here, the selectors SED1 to SED5 also operate in a similar manner.

When DP0=0, the selector SED0 selects the reference voltage VC. Since the both ends of the resistance element RD0 are set to the VC, the resistance element RD0 does not contribute to the result of the D/A conversion.

When DP0=1, the selector SED0 selects the VSH or the VSL in accordance with the XPOL. The selector SED0 selects the VSH when XPOL=1, and selects the VSL when XPOL=0. Since the voltage difference between the both ends of the resistance element RD0 is |VSH−VC| or |VSL−VC|, the resistance element RD0 contributes to the D/A conversion.

As illustrated in FIG. 5, the resistance values of the resistance elements RD0 to RD5 are 32×r0, 16×r0, 8×r0, 4×r0, 2×r0 and r0. Through the operation of FIG. 6, the resistance value rdac2 of the D/A conversion circuit DAC2 is set as in the following Equation (13).

[Mathematical Equation 13]

$$\frac{1}{rdac2} = \frac{1}{r0} \times \left( DP0 \times \frac{1}{32} + DP1 \times \frac{1}{16} + DP2 \times \frac{1}{8} + DP3 \times \frac{1}{4} + DP4 \times \frac{1}{2} + DP5 \times \frac{1}{1} \right) \quad (13)$$

Figure 7:
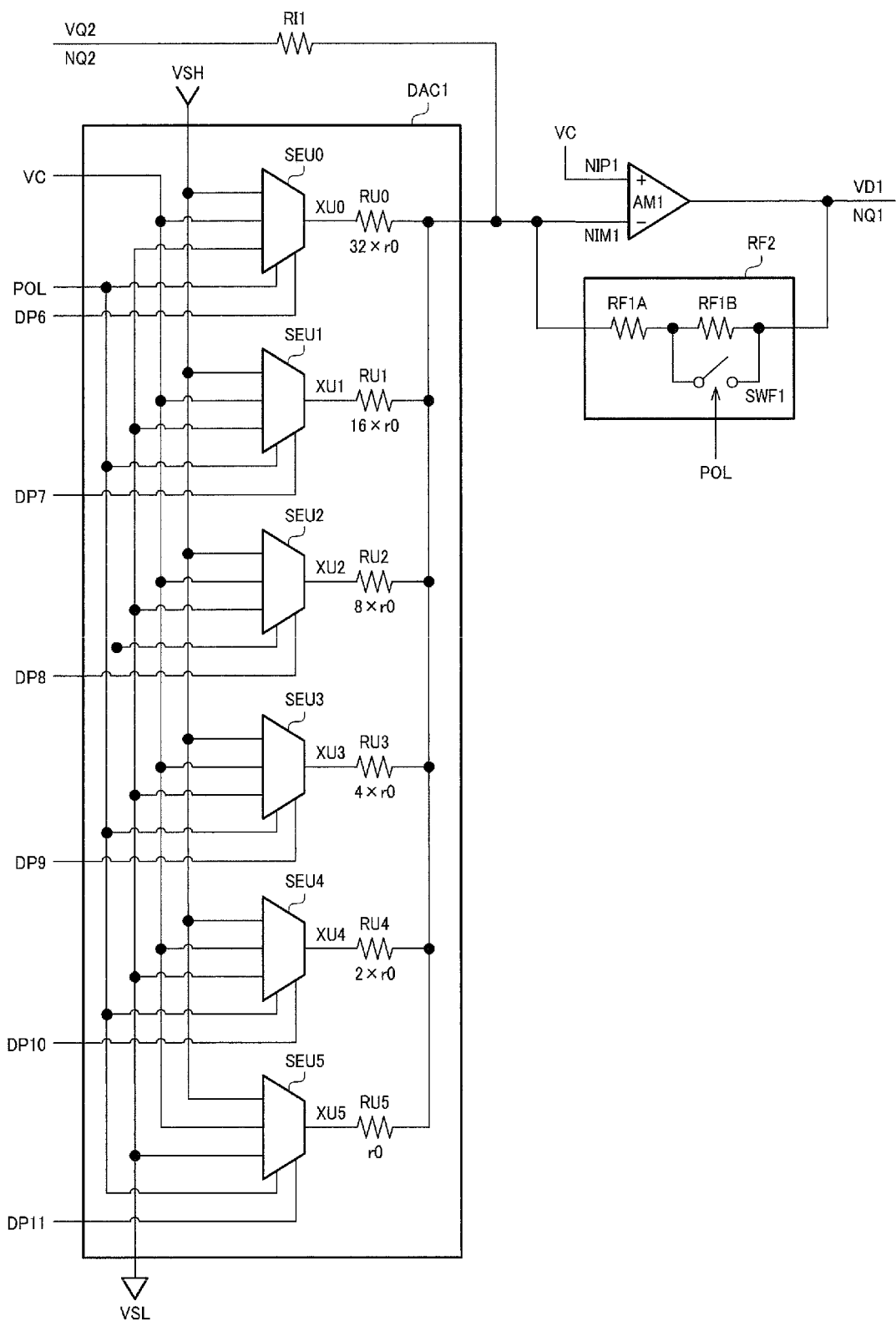
FIG. 7 illustrates a detailed exemplary configuration of a first D/A conversion circuit and a first resistance circuit.

FIG. 7 illustrates a detailed exemplary configurations of the D/A conversion circuit DAC1 and the resistance circuit RF1.

The resistance circuit RF1 includes a resistance element RF1A, a resistance element RF1B, and a switch element SWF1. One end of the resistance element RF1A is connected to the inverting input node NIM1 and the other end thereof is connected to one end of the resistance element RF1B. The other end of the resistance element RF1B is connected to the output node NQ1. The switch element SWF1 is connected in parallel to the resistance element RF1B. The switch element SWF1 is, for example, a transistor.

The resistance values of the resistance elements RF1A and RF1B are rf1a and rf1b, respectively. Note that the on resistance of the switch element SWF1 is assumed to be zero. The switching element SWF1 is turned on and off by the polarity signal POL. When POL=H, the switch element SWF1 is off. At this time, the resistance value of the resistance circuit RF1 is rf1m=rf1a+rf1b. When POL=L, the switch element SWF1 is on. At this time, the resistance value of the resistance circuit RF1 is rf2p=rf1a. The rf1a and rf1b are set to satisfy rf1m=(|VSL−VC|/|VSH−VC|)×rf1p. Note that it is assumed here that |VSH−VC|>|VSL−VC| holds. Also, rf1p=rf1a+rf1b=r0/2 holds.

The D/A conversion circuit DAC1 includes selectors SEU0 to SEU5 and resistance elements RU0 to RU5.

The selector SEU0 selects the power supply voltage VSH, the supply voltage VSL or the reference voltage VC on the basis of the bit signal DP6 and the polarity signal POL. The selector SEU0 outputs the selected voltage to one end of the resistance element RU0. The other end of the resistance element RU0 is connected to the inverting input node NIM1. Likewise, the selectors SEU1 to SEU5 select the power supply voltage VSH, the supply voltage VSL or the reference voltage VC on the basis of the bit signals DP7 to DP11 and the polarity signal POL. The selectors SEU1 to SEU5 output the selected voltage to one ends of the resistance elements RU1 to RU5. The other ends of the resistance elements RU1 to RU5 are connected to the inverting input node NIM1. The selectors SEU0 to SEU5 are switch circuits composed of, for example, transistors.

Figure 8:
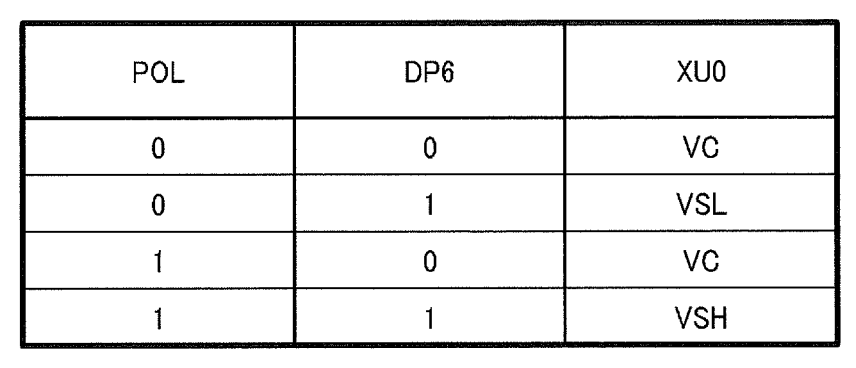

FIG. 8 is a diagram illustrating an operation of the selector SEU0. In FIG. 8, "0" represents a low level, and "1" represents a high level. While the selector SEU0 is described as an example here, the selectors SEU1 to SEU5 also operate in a similar manner.

When DP6=0, the selector SEU0 selects the reference voltage VC. Since the both ends of the resistance element RU0 are set to the VC, the resistance element RU0 does not contribute to the result of the D/A conversion.

When DP6=1, the selector SEU0 selects the VSH or the VSL in accordance with the POL. The selector SEU0 selects the VSL when POL=0, and selects the VSH when POL=1. Since the voltage difference between the both ends of the resistance element RU0 is |VSL−VC| or |VSH−VC|, the resistance element RU0 contributes to D/A conversion.

As illustrated in FIG. 7, the resistance values of the resistance elements RU0 to RU5 are 32×r0, 16×r0, 8×r0, 4×r0, 2×r0 and r0. Through the operation of FIG. 8, the resistance value rdac1 of the D/A conversion circuit DAC1 is set as in the following Equation (14).

[Mathematical Equation 14]

$$\frac{1}{rdac1} = \frac{1}{r0} \times \left( DP6 \times \frac{1}{32} + DP7 \times \frac{1}{16} + DP8 \times \frac{1}{8} + DP9 \times \frac{1}{4} + DP10 \times \frac{1}{2} + DP11 \times \frac{1}{1} \right) \quad (14)$$

By substituting the Equations (13) and (14) in Equation (6), the data voltage VD1 in the positive polarity driving is obtained. Also, by substituting the Equations (13) and (14) in Equation (12), the data voltage VD1 in the negative polarity driving is obtained.

3. Second Embodiment

Figure 9:
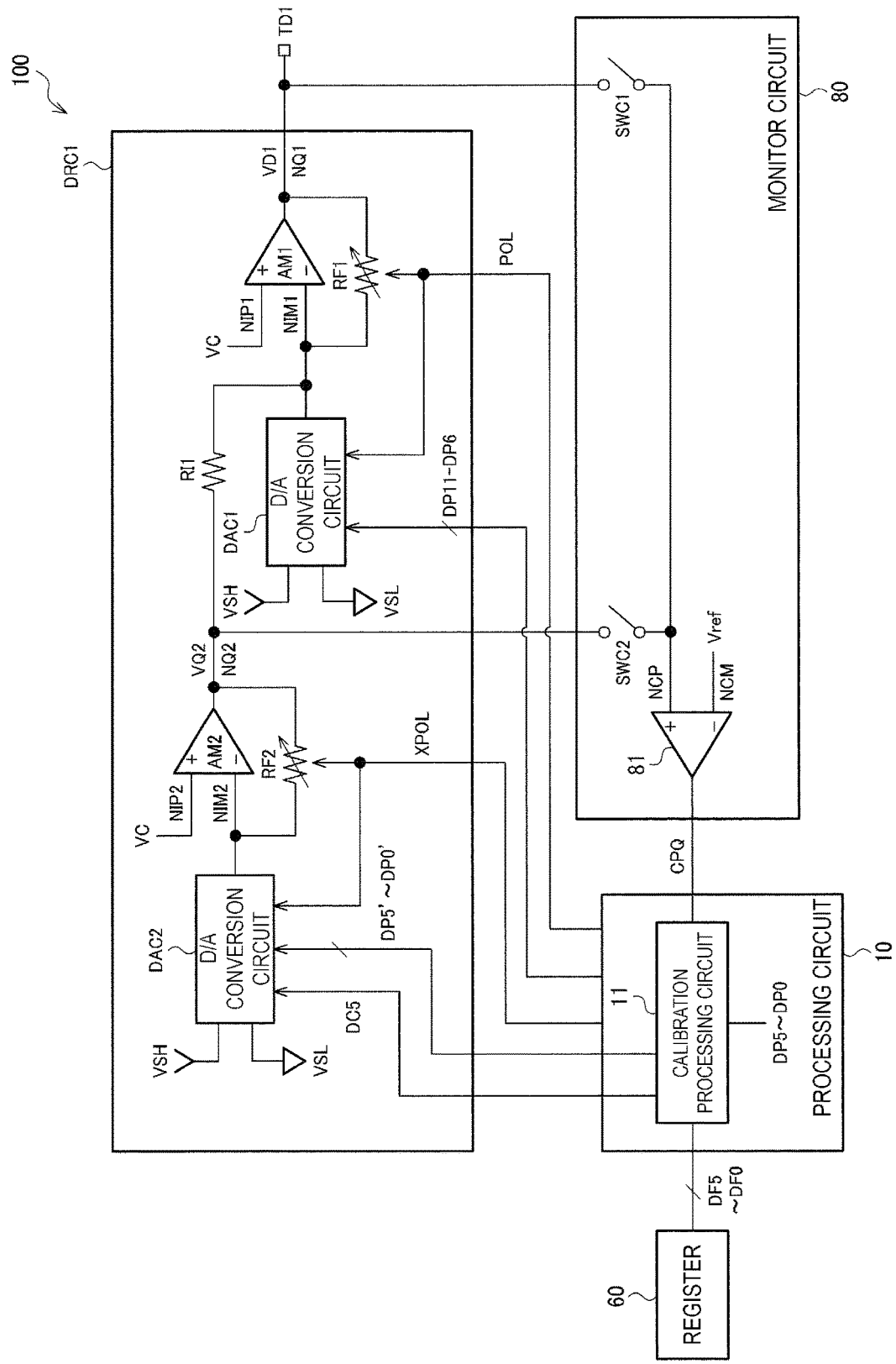
FIG. 9 illustrates an exemplary configuration of a display driver in a second embodiment.

FIG. 9 illustrates an exemplary configuration of the display driver 100 in a second embodiment. While the drive circuit DRC1 is illustrated as an example in FIG. 9, the drive circuits DRC2 to DRCn also have similar configurations. Note that the components that have been described above will be denoted with the same reference numerals, and the descriptions thereof will be appropriately omitted.

In the second embodiment, the display driver 100 further includes a monitor circuit 80. The processing circuit 10 includes a calibration processing circuit 11. To the D/A conversion circuit DRC2, lower bit data DP5' to DP0' and a carry signal DC5 are input from the calibration processing circuit 11.

The monitor circuit 80 monitors the output of the operational amplifier AM1. The monitor circuit 80 monitors the output of the operational amplifier AM2. To be more specific, the monitor circuit 80 includes a comparator 81 and switch elements SWC1 and SWC2. One end of the switch element SWC1 is connected to the output node NQ1 of the operational amplifier AM1, and the other end thereof is connected to a first input node NCP of the comparator 81. One end of the switch element SWC2 is connected to the output node NQ2 of the operational amplifier AM2, and the other end thereof is connected to the first input node NCP of the comparator 81. A comparison voltage Vref is input to a second input node NCM of the comparator 81. For example, the NCP is a non-inverting input node and the NCM is an inverting input node. The switch elements SWC1 and SWC2 are, for example, transistors.

The calibration processing circuit 11 determines offset correction data DF5 to DF0 by performing a calibration process on the basis of a signal CPQ, which is a monitoring result. The offset correction data is data for correcting the offset of the data voltage VD1 output by the operational amplifier AM1. The offset correction data DF5 to DF0 are six-bit data as with the lower bit data of the display data, and each of the DF5 to DF0 is a bit signal of the offset correction data. The offset correction data DF5 to DF0 are stored in the register 60. For example, during initialization upon power-on of the display driver 100, the calibration processing circuit 11 executes a calibration process. The procedure of the calibration process is described later.

Note that one monitor circuit 80 is provided for each of the drive circuits DRC1 to DRCn. In this case, the calibration processes of the drive circuits DRC1 to DRCn can be performed in parallel. Alternatively, it is also possible to adopt a configuration in which the switch elements SWC1 and SWC2 are provided to each of the drive circuits DRC1 to DRCn, and the drive circuits DRC1 to DRCn share one comparator 81. In this case, the calibration processes of the drive circuits DRC1 to DRCn are performed in a time-division manner.

During a normal operation in which the display driver 100 drives the electro-optical panel, the calibration processing circuit 11 adds the offset correction data DF5 to DF0 read from the register 60 and the lower bit data DP5 to DP0 of the display data to thereby output the lower bit data DP5' to DP0' and the carry signal DC5.

Figure 10:
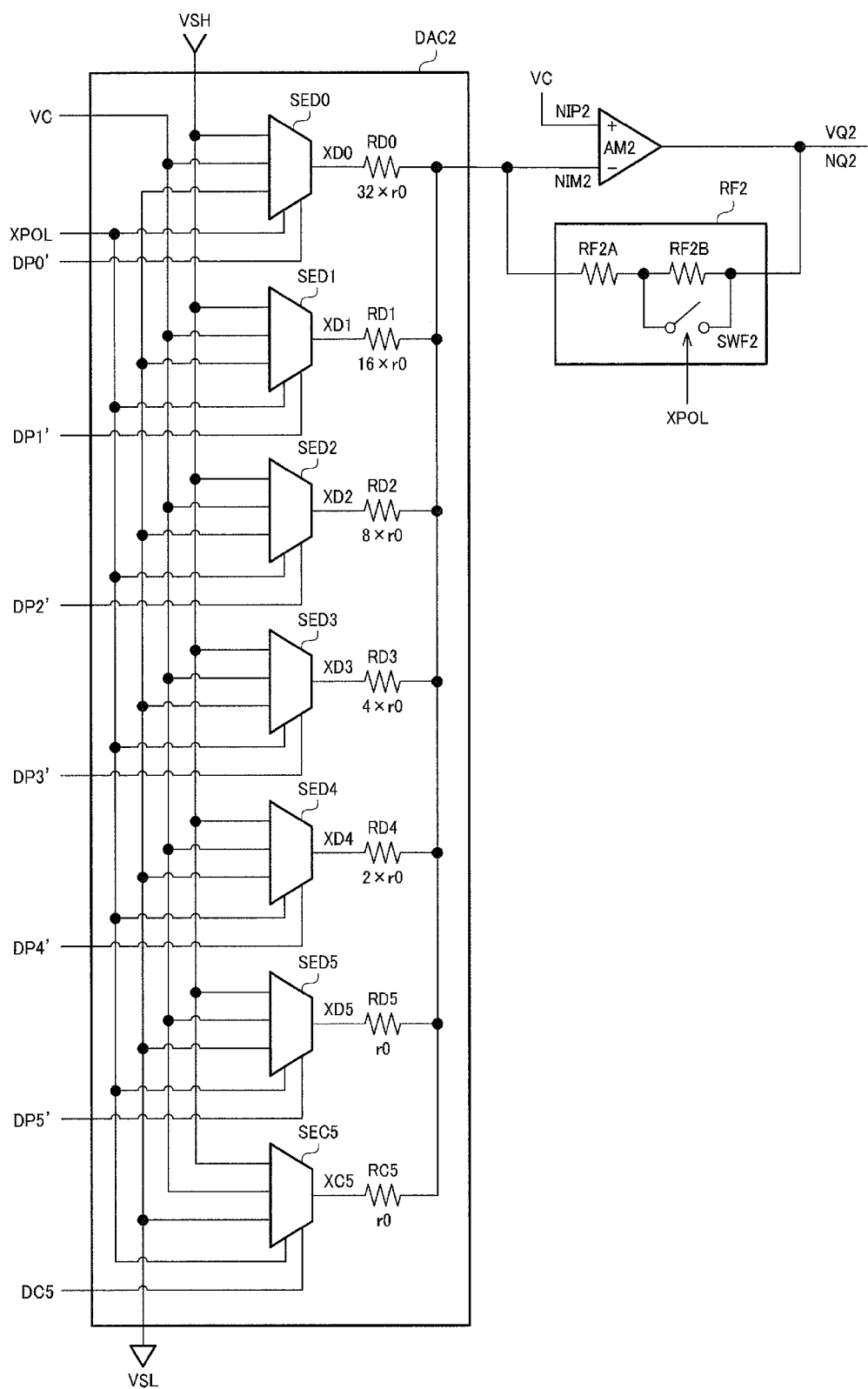
FIG. 10 illustrates a detailed exemplary configuration of the second D/A conversion circuit in the second embodiment.

FIG. 10 illustrates a detailed exemplary configuration of the D/A conversion circuit DAC2 in the second embodiment. Note that the components that have been described above will be denoted with the same reference numerals, and the descriptions thereof will be appropriately omitted.

In the second embodiment, the D/A conversion circuit DAC2 further includes a selector SEC5 and a resistance element RC5. Further, the lower bit data DP5' to DP0' are input to the selectors SED0 to SED5. The operation of the selectors SED0 to SED5 is similar to that of the first embodiment, and therefore the descriptions thereof will be appropriately omitted.

The selector SEC5 selects the power supply voltage VSH, the supply voltage VSL or the reference voltage VC on the basis of the carry signal DC5 and the reverse polarity signal XPOL. The selector SEC5 outputs a selected voltage XC5 to one end of the resistance element RC5. The other end of the resistance element RC5 is connected to the inverting input node NIM2. The selector SEC5 is a switch circuit composed of, for example, a transistor. The specific operation of the selector SEC5 is similar to that of the selector SED0. That is, in FIG. 6, the DP0 may be read as the DC5 and the XD0 may be read as the XC5.

The resistance value of the resistance element RC5 is r0, which is the same as the resistance value of the resistance element RD5. The resistance value rdac2 of the D/A conversion circuit DAC2 is expressed in the following Equation (15). By substituting the following Equations (15) and (14) in Equation (6), the data voltage VD1 in the positive polarity driving is obtained. In addition, by substituting the following Equations (15) and (14) in Equation (12), the data voltage VD1 in the negative polarity driving is obtained.

[Mathematical Equation 15]

$$\frac{1}{rdac2} = \frac{1}{r0} \times \left( DP0 \times \frac{1}{32} + DP1 \times \frac{1}{16} + DP2 \times \frac{1}{8} + DP3 \times \frac{1}{4} + DP4 \times \frac{1}{2} + DP5 \times \frac{1}{1} + DC5 \times \frac{1}{1} \right) \quad (15)$$

According to the present embodiment, the monitor circuit 80 monitors the output of the operational amplifier AM1. Then, the calibration processing circuit 11 adds the lower bit data DP5 to DP0 and the offset correction data DF5 to DF0 based on the monitoring result. In this manner, the offset of the data voltage VD1 can be corrected through D/A conversion of the result of the adding process by the D/A conversion circuit DAC2. In addition, adding the offset correction data DF5 to DF0 to the lower bit data DP5 to DP0 simplifies the process in comparison with a case where the data is added to the entire display data. While the monitor circuit 80 also monitors the output of the operational amplifier AM2 in the present embodiment, the monitor circuit 80 may monitor only the output of the operational amplifier AM1. The reason for this is that, since a gain of 1/64 times is applied to the offset of the operational amplifier AM2, it is less affected in comparison with the offset of the operational amplifier AM1.

In the present embodiment, the calibration processing circuit 11 outputs the carry signal DC5 and the lower bit data DP5' to DP0' as a result of the addition. Then, the D/A conversion circuit DAC2 converts the lower bit data DP5' to DP0' and the carry signal DC5. In this manner, offset correction can be achieved without changing the configuration of the D/A conversion circuit DAC1 that performs D/A conversion on the upper bit data DP11 to DP6.

Figure 11:
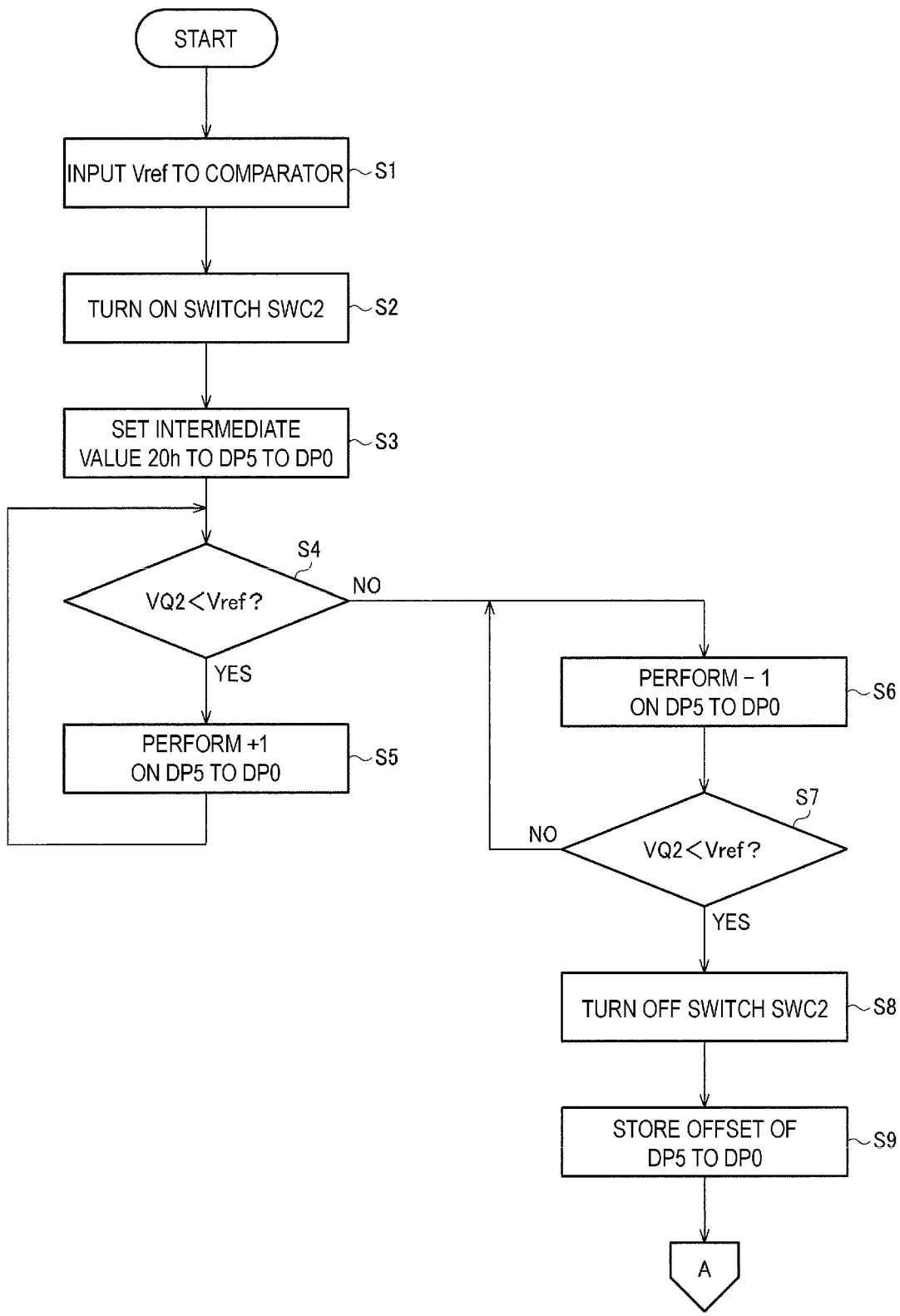
FIG. 11 is a flowchart illustrating a procedure of a calibration process.
Figure 12:
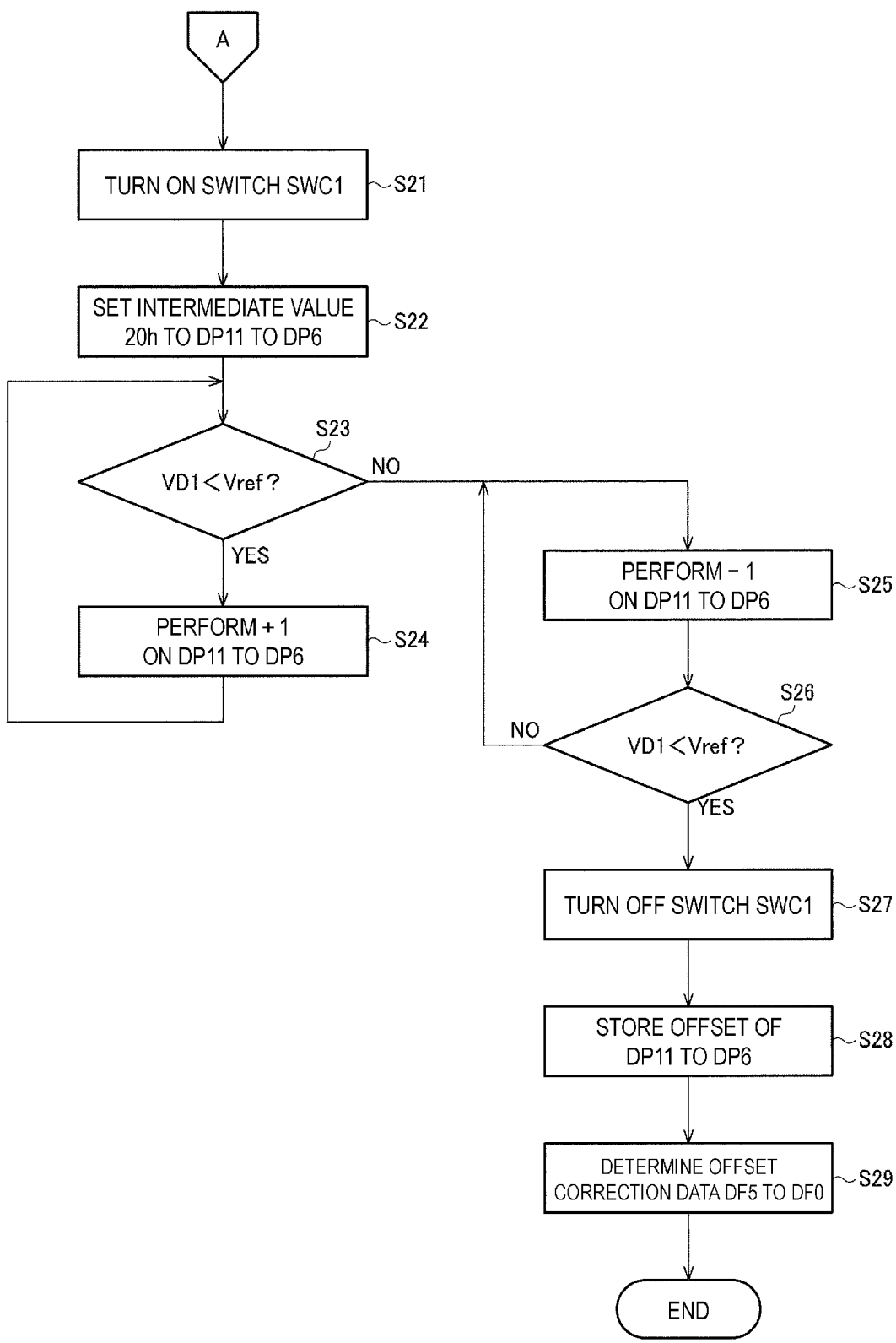
FIG. 12 is a flowchart illustrating a procedure of a calibration process.

A procedure of the calibration process is described below. FIGS. 11 and 12 are flowcharts illustrating a procedure of the calibration process.

When the calibration processing circuit 11 starts the calibration process, the comparison voltage Vref is input to the comparator 81 at step S1.

At step S2, the calibration processing circuit 11 turns on the switch SWC2. At step S3, the calibration processing circuit 11 sets the lower bit data DP5 to DP0 to an intermediate value 20h. The "h" represents a hexadecimal number. The intermediate value 20h corresponds to the comparison voltage Vref. Specifically, the ideal voltage in the case where D/A conversion of the intermediate value 20h is performed is the Vref. Note that the offset correction data DF5 to DF0 are set to 0h.

At step S4, the comparator 81 compares the output voltage VQ2 of the operational amplifier AM2 with the comparison voltage Vref. The calibration processing circuit 11 determines whether VQ2<Vref holds on the basis of an output signal CPQ of the comparator 81.

When VQ2<Vref holds at step S4, the calibration processing circuit 11 increments the lower bit data DP5 to DP0 at step S5 and the process is returned to step S4.

When VQ2<Vref does not holds at step S4, the calibration processing circuit 11 decrements the lower bit data DP5 to DP0 at step S6. Next, at step S7, the calibration processing circuit 11 determines whether VQ2<Vref holds on the basis of the output signal CPQ of the comparator 81.

When VQ2<Vref does not hold at step S7, the process is returned to step S6.

When VQ2<Vref holds at step S7, the calibration processing circuit 11 turns off the switch element SWC2 at step S8. Next, at step S9, the calibration processing circuit 11 stores the offset portion of the lower bit data DP5 to DP0 in the register 60. Specifically, the calibration processing circuit 11 stores, in the register 60, the result obtained by subtracting the intermediate value 20h from the lower bit data DP5 to DP0.

Next, at step S21, the calibration processing circuit 11 turns on the switch SWC1. At step S22, the calibration processing circuit 11 sets the upper bit data DP11 to DP6 to the intermediate value 20h.

At step S23, the comparator 81 compares the data voltage VD1 output by the operational amplifier AM1 with the comparison voltage Vref. The calibration processing circuit 11 determines whether VD1<Vref holds on the basis of the output signal CPQ of the comparator 81.

When VD1<Vref holds at step S23, the calibration processing circuit 11 increments the upper bit data DP11 to DP6 at step S24 and the process is returned to step S23.

When VD1<Vref does not hold at step S23, the calibration processing circuit 11 decrements the upper bit data DP11 to DP6 at step S25. Next, at step S26, the calibration processing circuit 11 determines whether VD1<Vref holds on the basis of the output signal CPQ of the comparator 81.

When VD1<Vref does not hold at step S26, the process is returned to step S25.

When VD1<Vref holds at step S26, the calibration processing circuit 11 turns off the switch element SWC1 at step S27. Next, at step S28, the calibration processing circuit 11 stores the offset portion of the upper bit data DP11 to DP6 in the register 60. Specifically, the calibration processing circuit 11 stores, in the register 60, the result obtained by subtracting the intermediate value $20h$ from the upper bit data DP11 to DP6.

Next, at step S29, the calibration processing circuit 11 determines the offset correction data DF5 to DF0 on the basis of the offset that is stored in the register 60 at step S9 and the offset that is stored in the register 60 at step S28. To be more specific, the calibration processing circuit 11 multiplies, by the gain $1/64$, the offset that is stored in the register 60 at step S9, and adds the result to the offset that is stored in the register 60 at step S28. The calibration processing circuit 11 stores, in the register 60, the result of the addition as the offset correction data DF5 to DF0.

4. Third Embodiment

Figure 13:
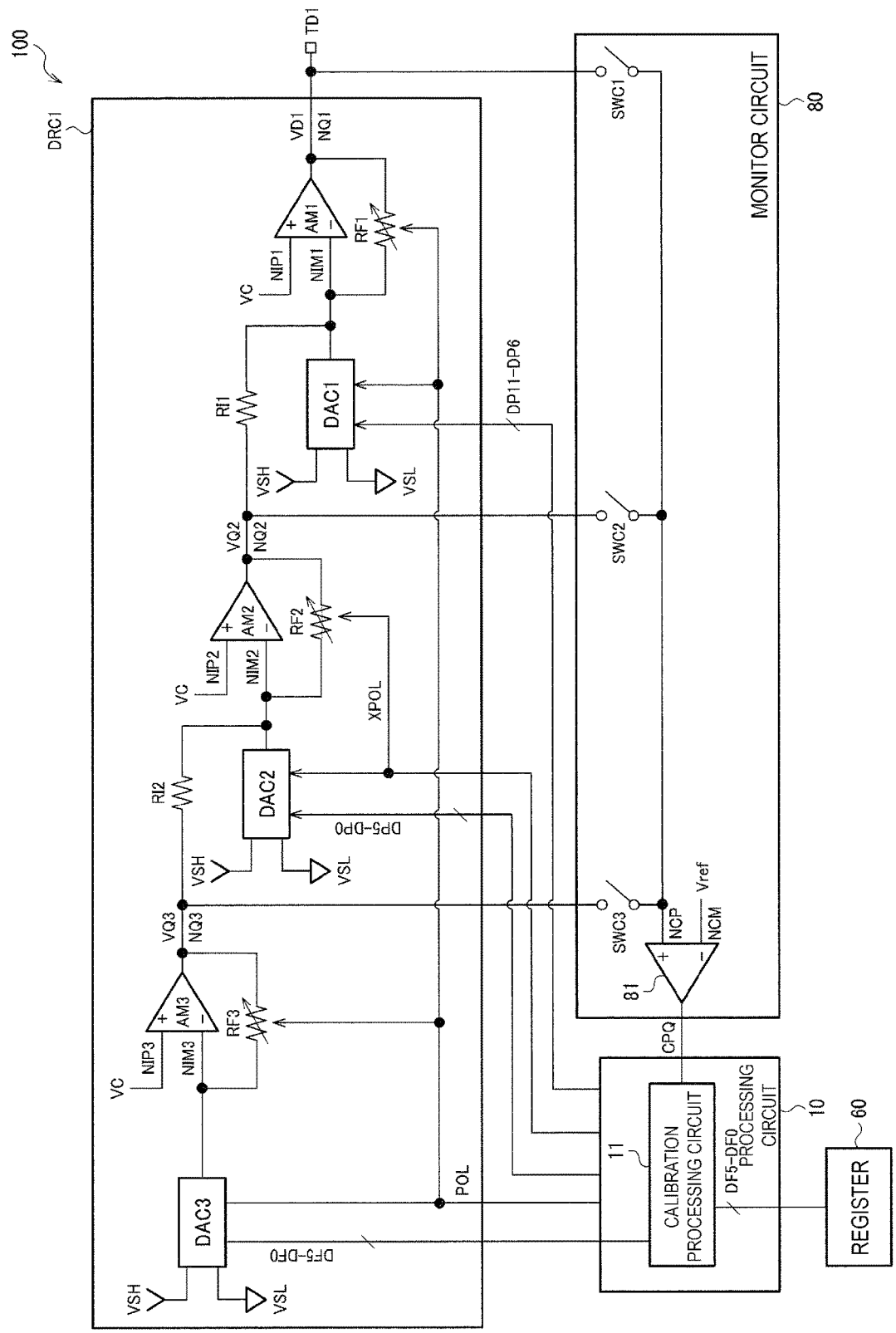
FIG. 13 illustrates an exemplary configuration of a display driver in a third embodiment.

FIG. 13 illustrates an exemplary configuration of the display driver 100 in a third embodiment. While the drive circuit DRC1 is illustrated as an example in FIG. 13, the drive circuits DRC2 to DRCn also have similar configurations. Note that the components that have been described above will be denoted with the same reference numerals, and the descriptions thereof will be appropriately omitted.

In the third embodiment, the drive circuit DRC1 further includes an operational amplifier AM3 that is a third operational amplifier, a resistance element RI2 that is a second resistance element, a D/A conversion circuit DAC3 that is a third D/A conversion circuit, and a resistance circuit RF3 that is a third resistance circuit.

An inverting input node NIM3, a non-inverting input node NIP3, and an output node NQ3 of the operational amplifier AM3 are a third inverting input node, a third non-inverting input node, and a third output node, respectively. The operational amplifier AM3 outputs a voltage VQ3 to the output node NQ3. The reference voltage VC is input to the non-inverting input node NIP3.

The resistance element RI2 is provided between the output node NQ3 of the operational amplifier AM3 and the inverting input node NIM2 of the operational amplifier AM2. Specifically, one end of the resistance element RI2 is connected to the output node NQ3 and the other end thereof is connected to the inverting input node NIM3. The resistance value of the resistance element RI2 is, but not limited to, r0/2, for example.

A first voltage is input to one end of the D/A conversion circuit DAC3. The power supply voltage VSL or the power supply voltage VSH is selected as the first voltage on the basis of the polarity signal POL. The other end of the D/A conversion circuit DAC3 is connected to the inverting input node NIM3 of the operational amplifier AM3. The D/A conversion circuit DAC3 is a third variable resistance circuit. The resistance value of the third variable resistance circuit is set based on the offset correction data DF5 to DF0. Specifically, the resistance value of the third variable resistance circuit is set to a binary-weighted resistance value for each bit of the DF5 to DF0.

The resistance circuit RF3 is provided between the inverting input node NIM3 and the output node NQ3. Specifically, one end of the resistance circuit RF3 is connected to the inverting input node NIM3, and the other end thereof is connected to the output node NQ3. The resistance circuit RF3 is capable of selecting a binary resistance value corresponding to the polarity. The resistance value of the resistance circuit RF3 is selected by the polarity signal POL. Note that in the case of |VSH−VC|=|VSL−VC|, the resistance value of the resistance circuit RF3 may be a fixed value.

The D/A conversion circuit DAC3 and the resistance circuit RF3 have configurations similar to the configurations of the D/A conversion circuit DAC1 and the resistance circuit RF1 illustrated in FIG. 7. That is, in FIG. 7, the DP11 to DP6 may be read as the DF5 to DF0.

In the above-described configuration, the D/A conversion circuit DAC3, the operational amplifier AM3 and the resistance circuit RF3 constitute a third binary-weighting D/A conversion circuit that performs D/A conversion on the offset correction data DF5 to DF0.

The monitor circuit 80 includes the comparator 81 and switch elements SWC1 to SWC3. One end of the switch element SWC3 is connected to the output node NQ3 of the operational amplifier AM3, and the other end thereof is connected to the first input node NCP of the comparator 81.

The procedure of the calibration process performed by the calibration processing circuit 11 is similar to the procedure illustrated in FIGS. 11 and 12. However, a procedure of measuring the offset of the voltage VQ3 output by the operational amplifier AM3 is additionally provided. In that procedure, the calibration processing circuit 11 turns on the switch element SWC3 and sets the DF5 to DF0 to the intermediate value $20h$. The calibration processing circuit 11 determines whether VQ3<Vref holds. When VQ3<Vref holds, the calibration processing circuit 11 increments the DF5 to DF0 and again determines whether VQ3<Vref holds. When VQ3<Vref does not hold, the calibration processing circuit 11 decrements the DF5 to DF0. When VQ3<Vref does not hold when determining whether VQ3<Vref holds, the calibration processing circuit 11 increments the DF5 to DF0 and again determines whether VQ3<Vref holds. When VQ3<Vref holds, the calibration processing circuit 11 turns off the switch element SWC3 and stores, in the register 60, the offset portion of the DF5 to DF0 as the offset of the VQ3. At step S29 of FIG. 12, the calibration processing circuit 11 determines the offset correction data DF5 to DF0 from the offset of step S9, the offset of step S28, and the offset of the VQ3 determined in the above-mentioned manner.

During a normal operation, the calibration processing circuit 11 outputs the offset correction data DF5 to DF0 stored in the register 60 to the D/A conversion circuit DAC3.

According to the present embodiment, the resistance value of the D/A conversion circuit DAC3 is set based on the offset correction data DF5 to DF0. As a result, the third binary-weighting D/A conversion circuit performs D/A conversion on the offset correction data DF5 to DF0, and the result of the D/A conversion is added to the output voltage VQ2 of the second binary-weighting D/A conversion circuit. In this manner, offset correction of the data voltage VD1 is achieved.

5. Fourth Embodiment

Figure 14:
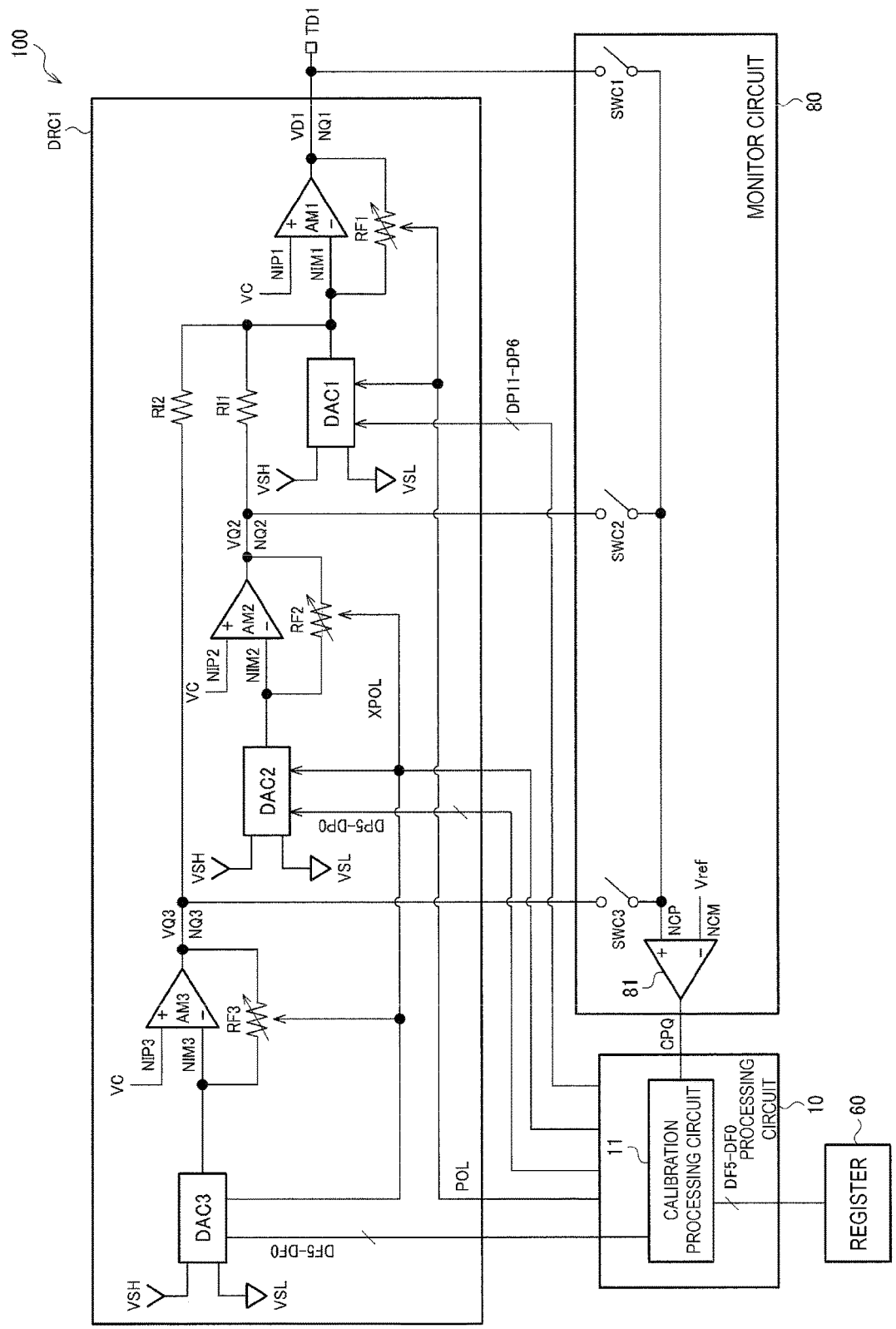
FIG. 14 illustrates an exemplary configuration of a display driver in a fourth embodiment.

FIG. 14 illustrates an exemplary configuration of the display driver 100 in a fourth embodiment. While the drive circuit DRC1 is illustrated as an example in FIG. 14, the drive circuits DRC2 to DRCn also have similar configurations. Note that the components that have been described above will be denoted with the same reference numerals, and the descriptions thereof will be appropriately omitted.

In the fourth embodiment, the resistance element RI2 is provided between the output node NQ3 of the operational amplifier AM3 and the inverting input node NIM1 of the operational amplifier AM1. Specifically, one end of the resistance element RI2 is connected to the output node NQ3 and the other end thereof is connected to the inverting input node NIM1.

In the fourth embodiment, the power supply voltage VSL or the power supply voltage VSH is selected based on the reverse polarity signal XPOL as the first voltage input to one end of the D/A conversion circuit DAC3.

In the fourth embodiment, the resistance value of the resistance circuit RF3 is selected by the reverse polarity signal XPOL.

The D/A conversion circuit DAC3 and the resistance circuit RF3 have configurations similar to the configurations of the D/A conversion circuit DAC2 and the resistance circuit RF2 in FIG. 5. That is, in FIG. 5, the DP5 to DP0 may be read as the DF5 to DF0.

In the above-described configuration, the D/A conversion circuit DAC3, the operational amplifier AM3 and the resistance circuit RF3 constitute the third binary-weighting D/A conversion circuit that performs D/A conversion on the offset correction data DF5 to DF0.

The procedure of the calibration process and the offset correction during a normal operation are similar to those of the third embodiment.

According to the present embodiment, the resistance value of the D/A conversion circuit DAC3 is set based on the offset correction data DF5 to DF0. As a result, the third binary-weighting D/A conversion circuit performs D/A conversion on the offset correction data DF5 to DF0, and the result of the D/A conversion is added to the data voltage VD1 output by the first binary-weighting D/A conversion circuit. In this manner, offset correction of the data voltage VD1 is achieved.

6. Electro-optical Device and Electronic Apparatus

Figure 15:
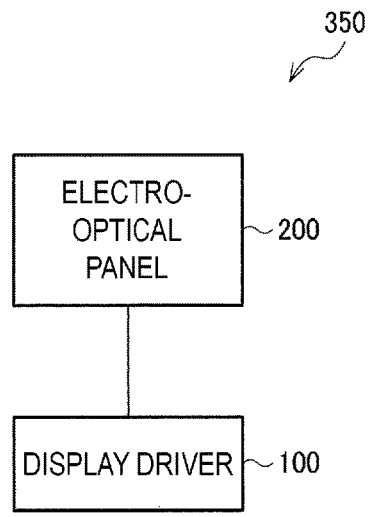
FIG. 15 is an exemplary configuration of an electro-optical device.

FIG. 15 illustrates an exemplary configuration of an electro-optical device 350 including the display driver 100. The electro-optical device 350 includes the display driver 100 and the electro-optical panel 200.

The electro-optical panel 200 is, for example, an active-matrix liquid crystal display panel. For example, the display driver 100 is mounted on a flexible substrate, and the flexible substrate is connected to the electro-optical panel 200 such that a data voltage output terminal of the display driver 100 and a data voltage input terminal of the electro-optical panel 200 are connected to each other through a wiring line formed on the flexible substrate. Alternatively, the display driver 100 may be mounted on a rigid substrate, and the rigid substrate and the electro-optical panel 200 may be connected to each other through a flexible substrate such that a data voltage output terminal of the display driver 100 and a data voltage input terminal of the electro-optical panel 200 are connected to each other through wiring lines formed on the rigid substrate and the flexible substrate.

Figure 16:
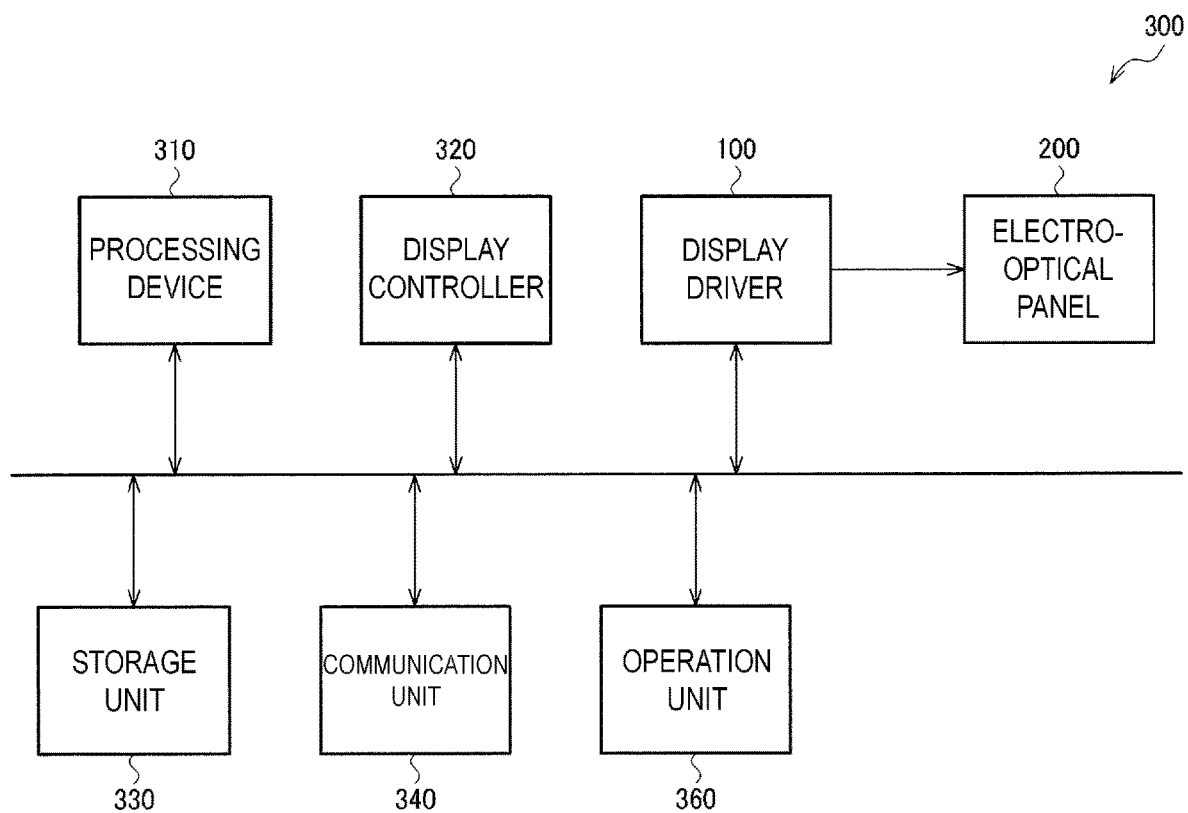
FIG. 16 is an exemplary configuration of an electronic apparatus.

FIG. 16 illustrates an exemplary configuration of the electronic apparatus 300 including the display driver 100. The electronic apparatus 300 includes a processing device 310, a display controller 320, the display driver 100, the electro-optical panel 200, a storage unit 330, a communication unit 340, and an operation unit 360. The storage unit 330 is also referred to as a storage device or a memory. The communication unit 340 is also referred to as a communication circuit or a communication device. The operation unit 360 is also referred to as an operation device. Specific examples of the electronic apparatus 300 may include various electronic apparatuses provided with a display device such as a projector, a head-mounted display, a mobile information terminal, a vehicle-mounted device, a portable game terminal, and an information processing device. The vehicle-mounted device is, for example, a meter panel, a car navigation system, or the like.

The operating unit 360 is a user interface for receiving various operations from a user. For example, the operating unit 360 is a button, a mouse, a keyboard, and/or a touch panel mounted on the electro-optical panel 200. The communication unit 340 is a data interface for inputting and outputting image data and control data. Examples of the communication unit 340 include a wireless communication interface of a wireless LAN or a near field communication, and a wired communication interface of a wired LAN or a USB. The storage unit 330 stores data input from the communication unit 340 or functions as a working memory of the processing device 310, for example. The storage unit 330 is a memory such as a RAM and a ROM, or a magnetic storage device such as an HDD, or, an optical storage device such as a CD drive and a DVD drive, for example. The display controller 320 processes image data input from the communication unit 340 or stored in the storage unit 330, and transfers the processed image data to the display driver 100. The display driver 100 displays an image on the electro-optical panel 200 on the basis of the image data transferred from the display controller 320. The processing device 310 performs a process of controlling the electronic device 300 and various signal processes. The processing device 310 is a processor such as a CPU and an MPU, or an ASIC, for example.

For example, in the case where the electronic apparatus 300 is a projector, the electronic apparatus 300 further includes a light source and an optical system. The optical system is a lens, a prism, a mirror, or the like, for example. In the case where the electro-optical panel 200 is of a transmissive type, the optical device emits light from the light source to the electro-optical panel 200 so as to project the light transmitted through the electro-optical panel 200 on a screen. In the case where the electro-optical panel 200 is of a reflective type, the optical device emits light from the light source to the electro-optical panel 200 so as to project the light reflected at the electro-optical panel 200 on a screen.

The display driver described in the embodiment includes the first operational amplifier, the first D/A conversion circuit, the first resistance circuit, the second operational amplifier, the resistance element, the second D/A conversion circuit, and the second resistance circuit. The first operational amplifier receives the reference voltage at the first non-inverting input node and drives the data line of the electro-optical panel. The first D/A conversion circuit includes the first variable resistance circuit including one end to which the first voltage is input, and another end connected to the first inverting input node of the first operational amplifier. The first resistance circuit is provided between the first inverting input node and the first output node of the first operational amplifier. In the second operational amplifier, the reference voltage is input to the second non-inverting input node. The resistance element is provided between the second output node of the second operational amplifier and the first inverting input node. The second D/A conversion circuit includes the second variable resistance circuit including one end to which the second voltage is input and another end connected to the second inverting input node of the second operational amplifier. The second resistance circuit is provided between the second inverting input node and the second output node. The resistance value of the first variable resistance circuit is set based on the upper bit data of the display data. The resistance value of the second variable resistance circuit is set based on the lower bit data of the display data.

In this manner, the first operational amplifier, the first D/A conversion circuit and the first resistance circuit constitute the first binary-weighting D/A conversion circuit, and the second operational amplifier, the second D/A conversion circuit and the second resistance circuit constitute the second binary-weighting D/A conversion circuit. The resistance element connects the first binary-weighting D/A conversion circuit and the second binary-weighting D/A conversion circuit. By using the binary-weighting D/A conversion circuit in this manner, the driving speed can be increased in comparison with D/A conversion circuits using a ladder resistance circuit. Specifically, since the binary-weighting D/A conversion circuit performs current driven electric potential generation, the speed of the change in data voltage can be increased.

In the present embodiment, the second binary-weighting D/A conversion circuit that performs D/A conversion on the lower bit data and the first binary-weighting D/A conversion circuit that performs D/A conversion on the upper bit data are connected. While the resistance values of the resistance elements in the first and second variable resistance circuits are binary-weighted in the binary-weighting D/A conversion circuit, the circuit size of the variable resistance circuit can be reduced with the configuration in which two binary-weighting D/A conversion circuits are connected.

In the present embodiment, when the first operational amplifier drives the data line in the positive polarity, the resistance value of the first resistance circuit may be set to the first resistance value, and the resistance value of the second resistance circuit may be set to the second resistance value. When the first operational amplifier drives the data line in the negative polarity, the resistance value of the first resistance circuit may be set to the third resistance value different from the first resistance value, and the resistance value of the second resistance circuit may be set to the fourth resistance value different from the second resistance value.

The first binary-weighting D/A conversion circuit outputs a voltage obtained by multiplying the difference between the first voltage and the reference voltage by a gain. Also, the second binary-weighting D/A conversion circuit outputs a voltage obtained by multiplying the difference between the second voltage and the reference voltage by a gain. When the polarity inversion driving is performed, the first and second voltages in the positive polarity driving and the first and second voltages in the negative polarity driving are different from each other. As such, it is necessary to change the gain in the positive polarity driving and the gain in the negative polarity driving. According to the present embodiment, the resistance values of the first and second resistance circuits in the positive polarity driving and the resistance values of the first and second resistance circuits in the negative polarity driving are different from each other. Thus, an appropriate gain can be set in accordance with the driving polarity.

Further, in the present embodiment, when the first operational amplifier drives the data line in the positive polarity, the first voltage may be set to the first power supply voltage that is lower than the reference voltage, and the second voltage may be set to the second power supply voltage that is higher than the reference voltage. When the first operational amplifier drives the data line in the negative polarity, the first voltage may be set to the second power supply voltage, and the second voltage may be set to the first power supply voltage.

The first and second binary-weighting D/A conversion circuits are inverting amplifier circuits. In the positive polarity driving, the first power supply voltage that is lower than the reference voltage is supplied to one end of the first D/A conversion circuit, and thus a positive data voltage is output by inverting amplification. In addition, the second power supply voltage that is higher than the reference voltage is supplied to one end of the second D/A conversion circuit, and accordingly the second binary-weighting D/A conversion circuit outputs a negative voltage. Then, inverting amplification is performed on that voltage, and thus a positive data voltage is output. Likewise, in the negative polarity driving, the second power supply voltage is supplied to one end of the first D/A conversion circuit, and the first power supply voltage is supplied to one end of the second D/A conversion circuit, and thus, a negative data voltage is output.

Further, in the present embodiment, the display driver may include a monitor circuit that monitors the output of the first operational amplifier, and a processing circuit that performs an adding process of adding the offset correction data based on the monitoring result and the lower bit data, and outputs the result of the adding process to the second D/A conversion circuit. The offset correction data may be data for correcting the offset of the data voltage output by the first operational amplifier.

In this manner, when the second D/A conversion circuit performs D/A conversion on the result of the adding process, the offset of the data voltage can be corrected. In addition, by adding the offset correction data to the lower bit data, the process is simplified in comparison with a case where the data is added to the entire display data.

In the present embodiment, the display driver may include the third operational amplifier, the second resistance element, the third D/A conversion circuit, and the third resistance circuit. In the third operational amplifier, a reference voltage may be input to the third non-inverting input node. The second resistance element may be provided between the third output node of the third operational amplifier and the second inverting input node of the second operational amplifier. The third D/A conversion circuit may include a third variable resistance circuit including one end to which a first voltage is input and another end connected to the third inverting input node of the third operational amplifier. The third resistance circuit may be provided between the third inverting input node and the third output node. The resistance value of the third variable resistance circuit may be set based on offset correction data for correcting the offset of the data voltage output by the first operational amplifier.

In this manner, the third operational amplifier, the third D/A conversion circuit and the third resistance circuit constitute the third binary-weighting D/A conversion circuit. The second binary-weighting D/A conversion circuit and the third binary-weighting D/A conversion circuit are connected by the second resistance element. In the present embodiment, the resistance value of the third variable resistance circuit is set based on the offset correction data. Thus, the third binary-weighting D/A conversion circuit performs D/A conversion on the offset correction data, and the result of the D/A conversion is added to the output voltage of the second binary-weighting D/A conversion circuit. In this manner, offset correction of the data voltage is achieved.

In the present embodiment, the display driver may include the monitor circuit that monitors the output of the first operational amplifier, and the processing circuit that outputs the offset correction data based on the result of the monitoring to the third D/A conversion circuit.

In this manner, when the third D/A conversion circuit performs D/A conversion on the offset correction data, the offset of the data voltage can be corrected.

In the present embodiment, the display driver may include the third operational amplifier, the second resistance element, the third D/A conversion circuit, and the third resistance circuit. In the third operational amplifier, a reference voltage may be input to the third non-inverting input node. The second resistance element may be provided between the third output node of the third operational amplifier and the first inverting input node. The third D/A conversion circuit may have the third variable resistance circuit including one end to which the second voltage is input and another end connected to the third inverting input node of the third operational amplifier. The third resistance circuit may be provided between the third inverting input node and the third output node. The resistance value of the third variable resistance circuit may be set based on offset correction data for correcting the offset of the data voltage output by the first operational amplifier.

In this manner, the third operational amplifier, the third D/A conversion circuit and the third resistance circuit constitute the third binary-weighting D/A conversion circuit. The first binary-weighting D/A conversion circuit and the third binary-weighting D/A conversion circuit are connected by the second resistance element. In the present embodiment, the resistance value of the third variable resistance circuit is set based on the offset correction data. Thus, the third binary-weighting D/A conversion circuit performs D/A conversion on the offset correction data, and the result of the D/A conversion is added to the data voltage output by the first binary-weighting D/A conversion circuit. In this manner, offset correction of the data voltage is achieved.

In the present embodiment, the display driver may include the monitor circuit that monitors the output of the first operational amplifier, and the processing circuit that outputs the offset correction data based on the result of the monitoring to the third D/A conversion circuit.

In this manner, when the third D/A conversion circuit performs D/A conversion on the offset correction data, the offset of the data voltage can be corrected.

The electro-optical device of the present embodiment includes any of the above-mentioned display drivers, and the electro-optical panel.

The electronic apparatus of the present embodiment includes any of the above-mentioned display drivers.

While the embodiments have been described in detail, it should be understood by those skilled in the art that various modifications may occur without substantially departing from the novel matters and effects of the present disclosure. Such modifications are encompassed by the scope of the disclosure. For example, a term in the descriptions or drawings given even once along with a different term having the identical or a broader meaning can be replaced with the different terms in any part of the descriptions or drawings. Any combinations of the embodiments and modifications are also encompassed by the scope of the disclosure. The configurations, the operations, and the like of the display driver, the electro-optical panel, the electro-optical device, and the electronic apparatus are not limited to those described in the embodiments, and various modifications may be made.

What is claimed is:

1. A display driver comprising:
a first operational amplifier including a first non-inverting input node to which a reference voltage is input, the first operational amplifier being configured to drive a data line of an electro-optical panel;
a first D/A conversion circuit including a first variable resistance circuit including one end to which a first voltage is input and another end connected to a first inverting input node of the first operational amplifier;
a first resistance circuit provided between the first inverting input node and a first output node of the first operational amplifier;
a second operational amplifier including a second non-inverting input node to which a reference voltage is input;
a resistance element provided between a second output node of the second operational amplifier and the first inverting input node;
a second D/A conversion circuit including a second variable resistance circuit including one end to which a second voltage is input and another end connected to a second inverting input node of the second operational amplifier; and
a second resistance circuit provided between the second inverting input node and the second output node, wherein
a resistance value of the first variable resistance circuit is set based on upper bit data of display data, and
a resistance value of the second variable resistance circuit is set based on lower bit data of the display data.

2. The display driver according to claim 1, wherein
when the first operational amplifier drives the data line in a positive polarity, a resistance value of the first resistance circuit is set to a first resistance value, and a resistance value of the second resistance circuit is set to a second resistance value; and
when the first operational amplifier drives the data line in a negative polarity, the resistance value of the first resistance circuit is set to a third resistance value different from the first resistance value, and the resistance value of the second resistance circuit is set to a fourth resistance value different from the second resistance value.

3. The display driver according to claim 1, wherein
when the first operational amplifier drives the data line in a positive polarity, the first voltage is set to a first power supply voltage that is lower than the reference voltage, and the second voltage is set to a second power supply voltage that is higher than the reference voltage; and
when the first operational amplifier drives the data line in a negative polarity, the first voltage is set to the second power supply voltage, and the second voltage is set to the first power supply voltage.

4. The display driver according to claim 1, comprising:
a monitor circuit configured to monitor an output of the first operational amplifier; and
a processing circuit configured to perform an adding process of adding offset correction data based on a monitoring result and the lower bit data, and to output a result of the adding process to the second D/A conversion circuit, wherein
the offset correction data is data for correcting an offset of a data voltage output by the first operational amplifier.

5. The display driver according to claim 1, comprising:
a third operational amplifier including a third non-inverting input node to which a reference voltage is input;
a second resistance element provided between a third output node of the third operational amplifier and the second inverting input node of the second operational amplifier;
a third D/A conversion circuit including a third variable resistance circuit including one end to which the first voltage is input and another end connected to a third inverting input node of the third operational amplifier; and
a third resistance circuit provided between the third inverting input node and the third output node, wherein
a resistance value of the third variable resistance circuit is set based on offset correction data for correcting an offset of a data voltage output by the first operational amplifier.

6. The display driver according to claim 5, comprising:
a monitor circuit configured to monitor an output of the first operational amplifier; and
a processing circuit configured to output the offset correction data based on a monitoring result to the third D/A conversion circuit.

7. The display driver according to claim 1, wherein
a third operational amplifier including a third non-inverting input node to which a reference voltage is input;
a second resistance element provided between a third output node of the third operational amplifier and the first inverting input node;
a third D/A conversion circuit including a third variable resistance circuit including one end to which the second voltage is input and another end connected to a third inverting input node of the third operational amplifier; and
a third resistance circuit provided between the third inverting input node and the third output node, wherein
a resistance value of the third variable resistance circuit is set based on offset correction data for correcting an offset of a data voltage output by the first operational amplifier.

8. The display driver according to claim 7, comprising:
a monitor circuit configured to monitor an output of the first operational amplifier; and
a processing circuit configured to output the offset correction data based on a monitoring result to the third D/A conversion circuit.

9. An electro-optical device comprising:
the display driver according to claim 1; and
the electro-optical panel.

10. An electronic apparatus comprising:
the display driver according to claim 1.

* * * * *